(12) United States Patent
Vivek et al.

(10) Patent No.: US 11,865,872 B2
(45) Date of Patent: Jan. 9, 2024

(54) INTERCONNECTS FOR ELECTRICAL COMPONENTS POSITIONED ADJACENT TO VEHICLE TIRES

(71) Applicant: TDK Corporation, Tokyo (JP)

(72) Inventors: Vibhu Vivek, San Jose, CA (US); Rakesh Sethi, San Jose, CA (US); Ishita Jain, San Jose, CA (US); John Sze, San Jose, CA (US)

(73) Assignee: TDK CORPORATION, Tokyo (JP)

( * ) Notice: Subject to any disclaimer, the term of this patent is extended or adjusted under 35 U.S.C. 154(b) by 267 days.

(21) Appl. No.: 17/086,730

(22) Filed: Nov. 2, 2020

(65) Prior Publication Data

US 2022/0134810 A1    May 5, 2022

(51) Int. Cl.
| | |
|---|---|
| *B60C 19/00* | (2006.01) |
| *B29D 30/06* | (2006.01) |
| *B60C 19/08* | (2006.01) |
| *H05K 1/11* | (2006.01) |
| *H01R 12/67* | (2011.01) |
| *H05K 3/12* | (2006.01) |
| *B60C 15/00* | (2006.01) |
| *H02N 2/18* | (2006.01) |
| *B29D 30/00* | (2006.01) |

(52) U.S. Cl.
CPC ........ *B60C 19/088* (2013.01); *B29D 30/0061* (2013.01); *B60C 15/00* (2013.01); *B60C 19/00* (2013.01); *B60C 19/082* (2013.01); *B60C 19/086* (2013.01); *H01R 12/67* (2013.01); *H02N 2/186* (2013.01); *H05K 1/118* (2013.01); *H05K 3/12* (2013.01); *B60C 2019/004* (2013.01); *H01R 2201/26* (2013.01); *H05K 2201/09045* (2013.01)

(58) Field of Classification Search
CPC ... B60C 19/00; B60C 23/041; B60C 23/0493; B29D 30/0061
See application file for complete search history.

(56) References Cited

U.S. PATENT DOCUMENTS 4,851,809 A * 7/1989 McAlister ........... B60C 23/0493
116/34 A
4,918,423 A    4/1990 Fukuyama et al.
(Continued)

FOREIGN PATENT DOCUMENTS

| CN | 114435036 A | 5/2022 |
|---|---|---|
| EP | 2186657 A1 | 5/2010 |

(Continued)

OTHER PUBLICATIONS

Machine translation for Korea 2020-0121408 (Year: 2023).*
(Continued)

*Primary Examiner* — Steven D Maki
(74) *Attorney, Agent, or Firm* — Morgan, Lewis & Bockius LLP

(57) ABSTRACT

Electrical connector assemblies mountable on a tire of a wheel of a vehicle are described. An electrical connector assembly may include one or more electrical conductors, a respective electrical conductor extending from an inside surface of the tire to an outside surface of the tire. Tire assemblies including at least partially embedded electrical connector assemblies and wheel assemblies including such tire assemblies are also described.

21 Claims, 19 Drawing Sheets

(56) References Cited

U.S. PATENT DOCUMENTS

| | | | |
|---|---|---|---|
| 6,339,956 B1 | 1/2002 | Huinink et al. | |
| 9,935,563 B2 | 4/2018 | Tatarchuk et al. | |
| 2003/0217797 A1* | 11/2003 | Poulbot | B60C 23/0493 |
| | | | 156/123 |
| 2010/0274607 A1 | 10/2010 | Carresjo et al. | |
| 2011/0308683 A1 | 12/2011 | Crano | |
| 2019/0280396 A1* | 9/2019 | Lazzi | H01L 23/42 |
| 2020/0049581 A1 | 2/2020 | Thornham et al. | |
| 2020/0114706 A1* | 4/2020 | Vivek | G01L 9/08 |
| 2021/0028725 A1* | 1/2021 | Griswold | B60C 23/0411 |
| 2022/0194148 A1* | 6/2022 | Wei | B60C 23/041 |
| 2023/0008775 A1* | 1/2023 | Omote | G01P 15/125 |

FOREIGN PATENT DOCUMENTS

| | | | |
|---|---|---|---|
| JP | 52-047202 B4 * | 4/1977 | |
| JP | 2022-074141 A | 5/2022 | |
| KR | 2020-0121408 A * | 10/2020 | |
| WO | 01/68388 A1 | 9/2001 | |

OTHER PUBLICATIONS

Machine translation for Japan 52-047202 (Year: 2023).*
Extended European Search Report issued in related European Patent Application No. 22207708.3 dated Apr. 4, 2023.

* cited by examiner

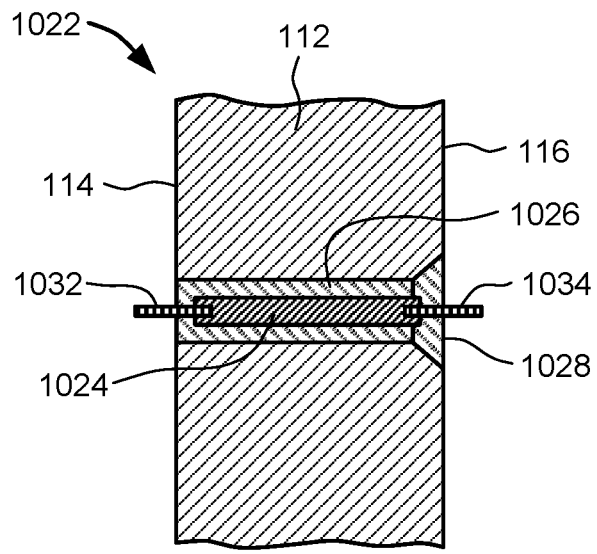
FIG. 12A
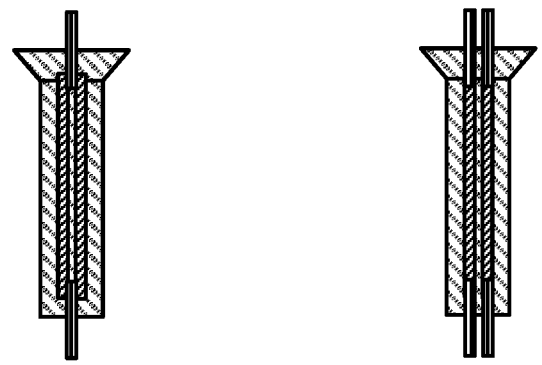 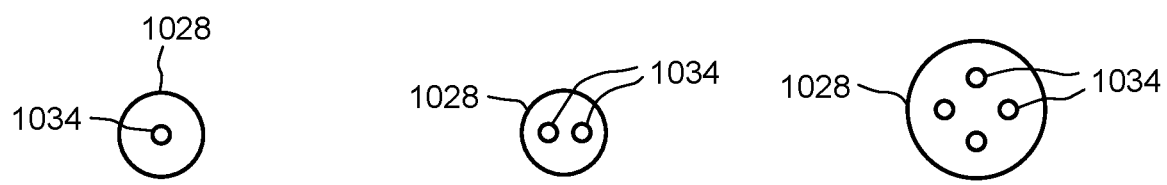
FIG. 12B  FIG. 12C  FIG. 12D

INTERCONNECTS FOR ELECTRICAL COMPONENTS POSITIONED ADJACENT TO VEHICLE TIRES

TECHNICAL FIELD

This application relates generally to interconnects, and more particularly to electrical connectors mountable to vehicle tires, rims, and wheels.

BACKGROUND

Advances in automotive sensing technologies have improved the safety and performance of automotive vehicles, which has led to a greater demand for advanced sensing applications to complement the existing electronic safety systems.

SUMMARY

Such demand has led to measurements of temperature, pressure, acceleration, and forces (static and dynamic) exerted on tires, wheels, and automotive vehicles. However, many of these sensors require electrical power for operation and data transmission. In addition, frequent measurements (and transmission) of data have increased an amount of power required for such sensors. Energy storage devices (e.g., lithium ion batteries) have a limited capacity and often present challenges associated with low durability, difficulty of replacement, and inferior sustainability. Such energy storage devices are typically subjected to accelerated discharge cycles, resulting in frequent or premature replacement of entire sensor modules, thereby increasing the overall cost of ownership and maintenance for the automotive vehicle.

The devices and methods described herein address challenges associated with conventional devices and methods for providing electrical power to sensor modules. Utilizing an energy-harvesting device (e.g., an electrical power generator that converts kinetic, thermal, optical, and mechanical energy available from the automotive vehicle, such as rotation, acceleration, deceleration, and/or vibration, of the wheels, into electrical energy) may replace conventional energy storage devices or, when used in conjunction, prolong the life expectancy of such energy storage devices. Such energy-harvesting devices are typically mounted where the source energy (e.g., kinetic, thermal, optical, or mechanical energy) is readily available (e.g., adjacent to a bead area of a tire mounted in a wheel). The disclosed devices allow electrical connection between an energy harvesting device mounted on an outside of a tire and sensors are mounted on an inside of the tire and/or the wheel while maintaining air tight seal for the tires, thereby allowing the energy-harvesting device to be placed at a location that is advantageous for energy harvesting, while allowing sensors located on the inside of the tire and/or the wheel to receive electrical power from the energy-harvesting device. Additionally or alternatively, an energy-harvesting device may be used as a sensor on its own, as the electrical signal from the energy-harvesting device typically contains information about the movement of the energy-harvesting device and a portion of the tire and/or the wheel where the energy-harvesting device is mounted.

In accordance with some embodiments, an electrical connector assembly mountable on a tire and/or a wheel of a vehicle includes one or more electrical conductors. A respective electrical conductor extends from an inside surface of the tire to an outside surface of the tire and/or the wheel.

In accordance with some embodiments, a tire assembly includes a tire having an inside surface, an outside surface opposite to the inside surface, and a tire bead region; and two or more electrical conductors extending from the inside surface of the tire to at least the tire bead region.

In accordance with some embodiments, a tire assembly includes a tire and one or more electrical connector assemblies embedded at least partially in the tire. Each electrical connector assembly of the one or more electrical connector assemblies corresponds to any electrical connector assembly described herein.

In accordance with some embodiments, a tire assembly includes a tire defining a hollow channel; a liquid metal filling at least a portion of the hollow channel defined in the tire; one or more external conductive stubs electrically coupled with the liquid metal within the hollow channel and extending to an outside surface of the tire; and one or more internal conductive stubs electrically coupled with the liquid metal within the hollow channel and extending to an inside surface of the tire.

In accordance with some embodiments, a wheel assembly includes a wheel with two or more connecting electrical conductors, and any tire assembly described herein. The tire assembly is mounted on the wheel, and the two or more connecting electrical conductors are configured to come into contact with the two or more electrical conductors of the tire assembly.

In accordance with some embodiments, a wheel assembly includes a wheel; any tire assembly described herein and mounted on the wheel; an energy harvester mounted on the wheel; and one or more electrical components electrically connected to the energy harvester via one or more electrical conductors.

BRIEF DESCRIPTION OF THE DRAWINGS

The disclosed devices and methods allow electrical connection between an energy-harvesting device and other electrical components located inside a tire and/or a wheel.

For a better understanding of the various described embodiments, reference should be made to the Description of Embodiments below, in conjunction with the following drawings in which like reference numerals refer to corresponding parts throughout the figures.

FIG. 12A is a cross-sectional view of a side wall with a plug including liquid metal in accordance with some embodiments.

FIGS. 12B-12D are front elevational views and cross-sectional views of a plug head in accordance with some embodiments.

DESCRIPTION OF EMBODIMENTS

Reference will be made to embodiments, examples of which are illustrated in the accompanying drawings. In the following description, numerous specific details are set forth in order to provide a thorough understanding of the various described embodiments. However, it will be apparent to one of ordinary skill in the art that the various described embodiments may be practiced without these particular details. In other instances, methods, procedures, components, circuits, and networks that are well-known to those of ordinary skill in the art are not described in detail so as not to unnecessarily obscure aspects of the embodiments.

It will be understood that, although the terms first, second, etc. may be used herein to describe various elements, these elements should not be limited by these terms. These terms are only used to distinguish one element from another. For example, a first cantilever could be termed a second cantilever, and, similarly, a second cantilever could be termed a first cantilever, without departing from the scope of the various described embodiments. The first cantilever and the second cantilever are both cantilevers, but they are not the same cantilever.

The terminology used in the description of the embodiments herein is for the purpose of describing particular embodiments only and is not intended to be limiting of the scope of claims. As used in the description and the appended claims, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Figure 1A:
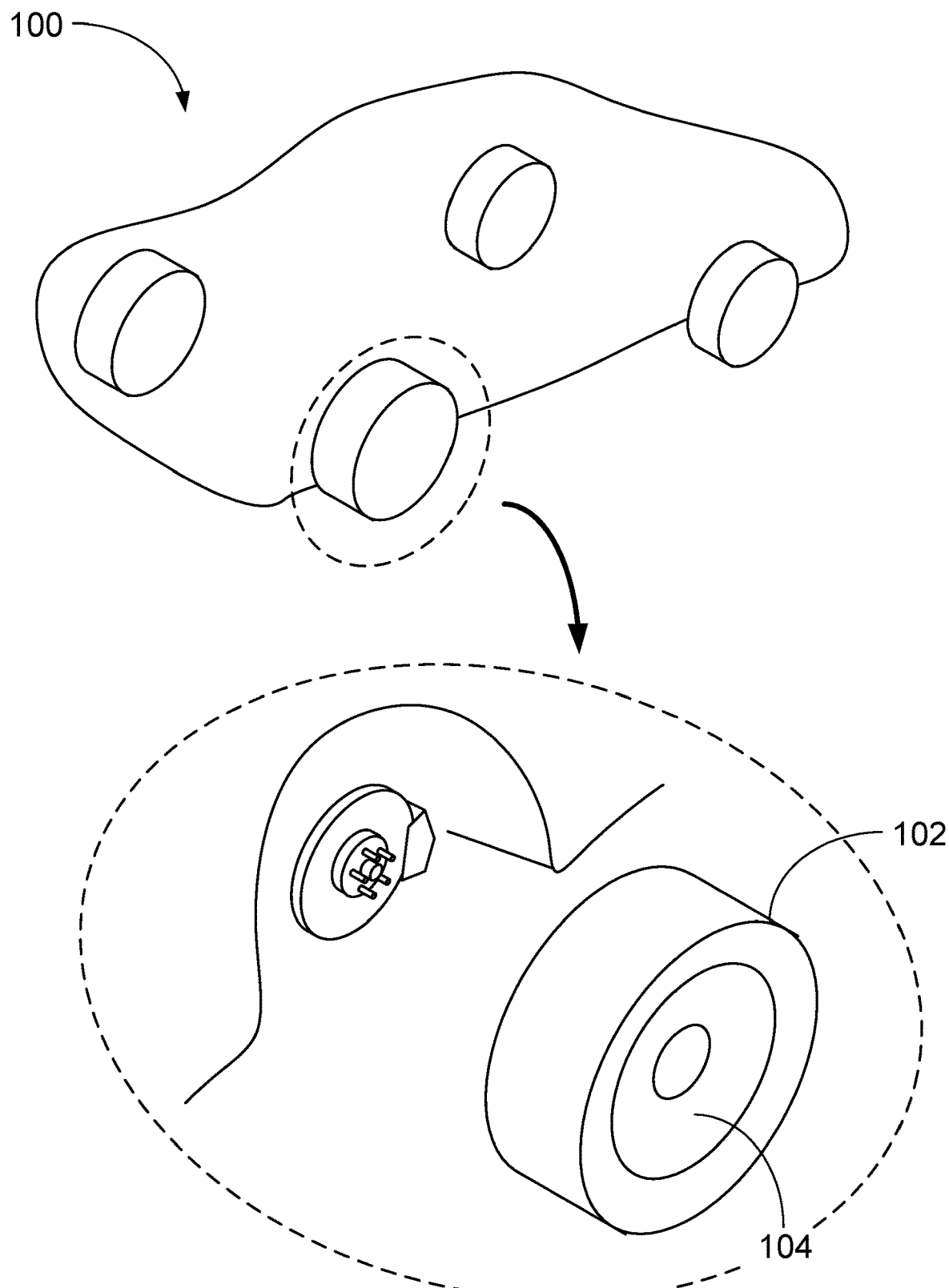
FIG. 1A is a schematic diagram illustrating parts of an automobile in accordance with some embodiments.

FIG. 1A is a schematic diagram illustrating parts of an automobile 100 (also called herein a vehicle or an automotive vehicle) in accordance with some embodiments. In some embodiments, the automobile 100 includes a wheel 104 and a tire 102 mounted on the wheel 104.

Figure 1B:
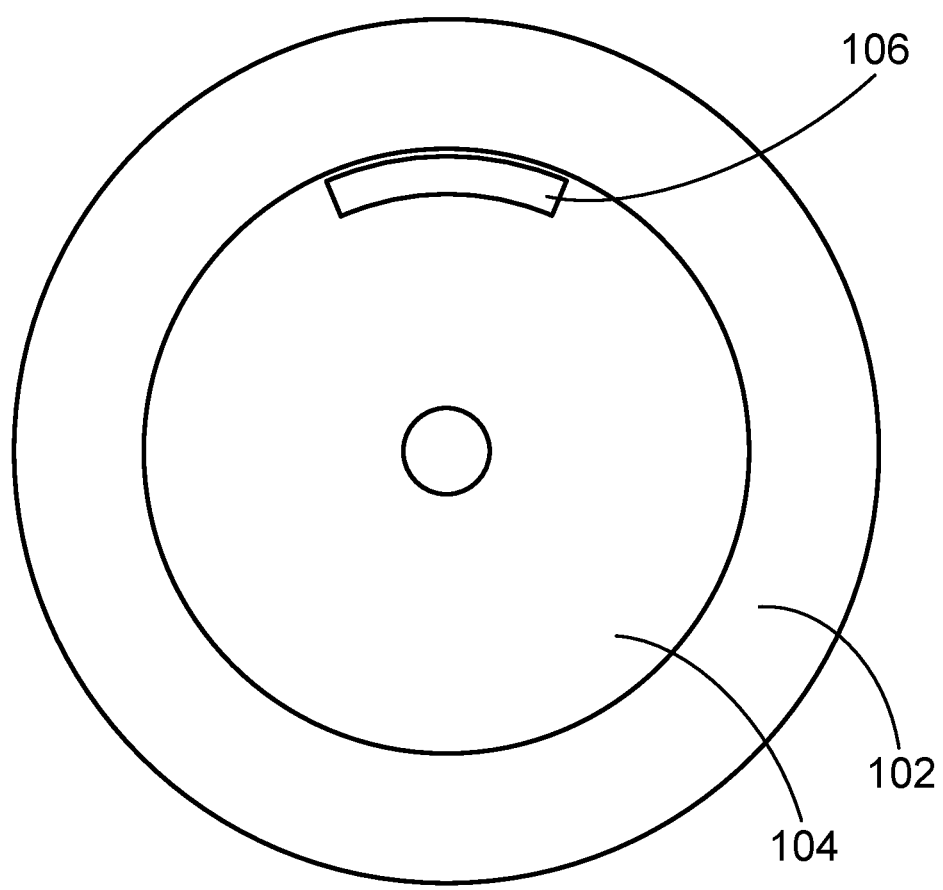
FIG. 1B is a schematic diagram illustrating an energy-harvesting device mounted on a wheel in accordance with some embodiments.

FIG. 1B is a schematic diagram illustrating an energy-harvesting device 106 mounted on a wheel 104 in accordance with some embodiments. In FIG. 1B, the energy-harvesting device 106 is positioned adjacent to a rim of the wheel 104. Positioning of the energy-harvesting device 106 adjacent to the rim of the wheel 104 is advantageous for energy-harvesting devices that utilize the centrifugal force, its variation, and/or associated vibration for energy harvesting (e.g., converting kinetic, mechanical energy into electrical energy). Although FIG. 1B shows only one energy-harvesting device 106 mounted on the wheel 104, in some embodiments, two or more energy-harvesting devices are mounted on the wheel 104.

Figure 1C:
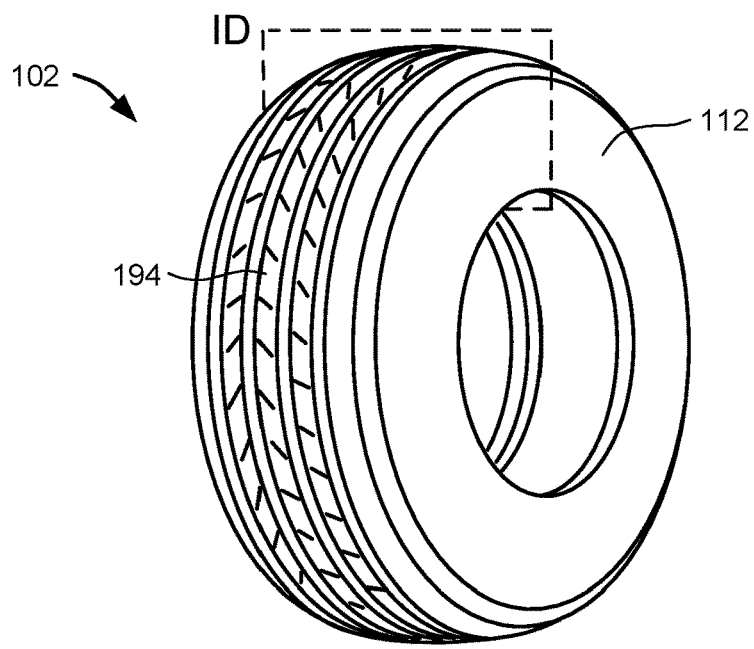
FIG. 1C illustrates a tire in accordance with some embodiments.

FIG. 1C illustrates a tire 102 in accordance with some embodiments. The tire 102 has a side wall 112 and a tread region 194 on which electrical connectors may be mounted to electrically connect an energy-harvesting device to one or more electrical components located within the tire 102. FIG. 1C also shows a plane ID from which the cross-section shown in FIG. 1D is taken.

Figure 1D:
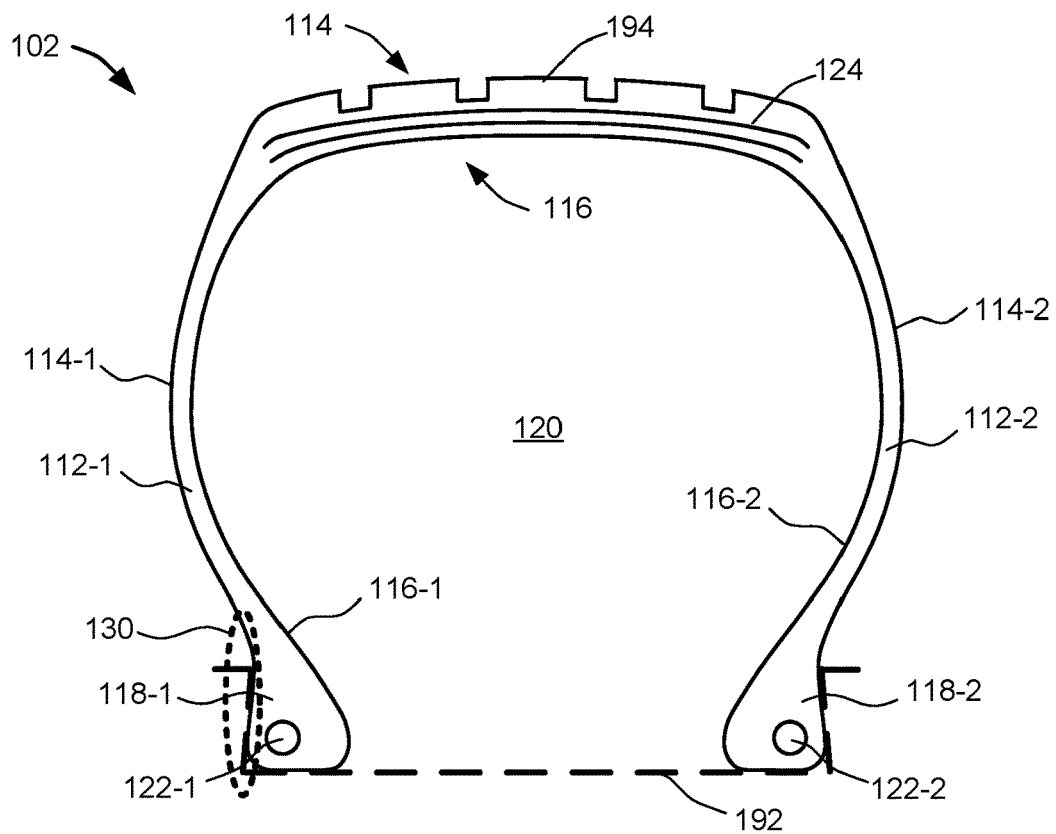
FIG. 1D is a cross-sectional view of the tire shown in FIG. 1C.

FIG. 1D is a cross-sectional view of the tire 102 shown in FIG. 1C. The tire 102 has the tread region 194 extending between two side walls 112-1 and 112-2 (one of which may be called an outer side wall and the other may be called an inner side wall, or vice versa, depending on an orientation of how the tire is mounted on a wheel). The tire 102 has an outer surface 114, including a portion 114-1 of the outer surface 114 on the outer side wall 112-1 and a portion 114-2 of the outer surface 114 on the inner side wall 112-2, and an inner surface 116, including a portion 116-1 of the inner surface 116 on the outer side wall 112-1 and a portion 116-2 of the inner surface 116-2 on the inner side wall 112-2. The tire 102 also has bead regions 118-1 and 118-2, which contacts a rim 192 of a wheel 104 when the tire 102 is mounted on the wheel 104. In FIG. 1D, the bead regions 118-1 and 118-2 also include bead wires 122-1 and 122-2. In FIG. 1D, the tire also includes one or more belts 124 in the tread region 194.

Although the tire 102 has an open shape (e.g., air may freely enter the space 120 between the side walls 112-1 and 112-2 through an opening toward a center of the tire when the tire is not mounted on a wheel), when the tire 102 is mounted on a wheel, the rim 192 of the wheel seals the opening so that the air within the space 120 is maintained within the space 120. As used herein, this space 120 is called an inside space of the tire 102.

In some configurations, one or more electrical components are located within the space 120 of the tire 102 (e.g., one or more sensors to measure rotation, acceleration, deceleration, vibration, temperature, pressure, etc.) while one or more energy-harvesting devices are located outside the space 120 (e.g., a region 130 between the rim 192 or its rim lip and the bead region 118-1 or 118-2). Because the tire 102 is typically made of an electrically insulating material (e.g., rubber), an electrical connector that can relay power from the one or more energy-harvesting devices located outside the space 120 to the one or more electrical components located within the space 120.

Figure 2A:
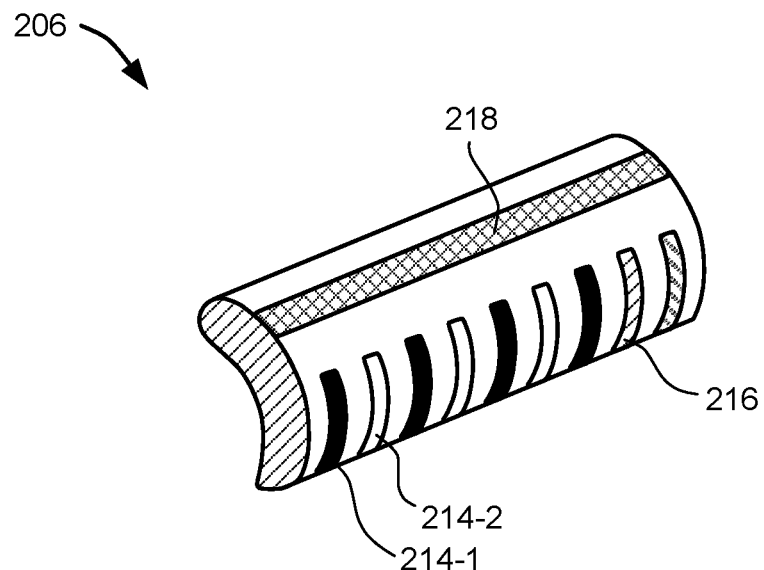
FIG. 2A shows an energy-harvesting device in accordance with some embodiments.

FIG. 2A shows an energy-harvesting device 206 in accordance with some embodiments. In some configurations, the energy-harvesting device 206 has a concave-convex shape for mounting between the rim lip of a wheel and the bead region of a tire. The energy-harvesting device 206 includes a plurality of electrical conductors 214 (including electrical conductors 214-1 and 214-2) positioned on the convex surface of the energy-harvesting device 206 (configured to face the bead region of the tire). The electrical conductors 214 are coupled with an internal circuitry. In FIG. 2A, the electrical conductors 214 are spaced apart to electrically isolate the electrical conductors 214. In some configurations, the electrical conductors 214 provide electrical power (e.g., an electrical current) generated by the energy-harvesting device 206 (and in such configurations, the electrical conductors 214 are called power lines). In some configurations, the energy-harvesting device 206 also includes additional electrical conductors 216 for sending or receiving data or control signals. For example, the energy-harvesting device 206 may provide different levels of electrical power to different electrical conductors 214 based on information the energy-harvesting device 206 receives from one or more electrical components located inside the tire. In FIG. 2A, the electrical conductors 214 extend substantially radially relative to the wheel on which the energy-harvesting device 206 is configured to be mounted.

In some configurations, the energy-harvesting device 206 also includes an environmental barrier 218. The environmental barrier 218 may be a sealing material (e.g., rubber or polymers) so that when the energy-harvesting device 206 is mounted on a wheel against a tire, the environmental barrier 218 prevents or reduces contaminants (e.g., water, dirt, etc.) from entering into the space between the energy-harvesting device 206 and the tire. This feature reduces or eliminates damages to the electrical conductors 214 and prevents short circuits between the electrical conductors 214.

Figure 2B:
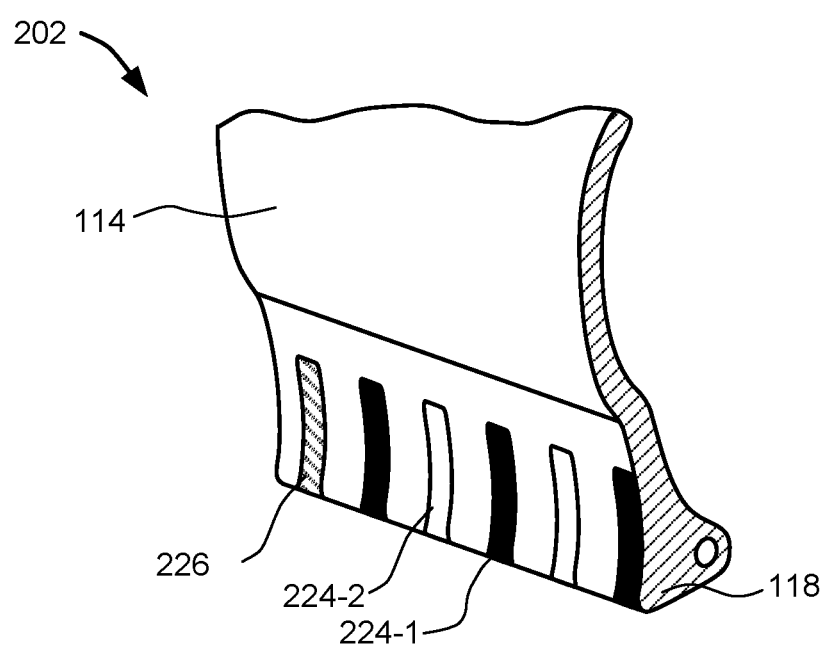
FIG. 2B shows a portion of a tire configured to couple with the energy-harvesting device shown in FIG. 2A in accordance with some embodiments.

FIG. 2B shows a portion of a tire 202 configured to couple with the energy-harvesting device shown in FIG. 2A in accordance with some embodiments. The tire 202 includes a plurality of electrical conductors 224 (including electrical conductors 224-1 and 224-2) on an outside surface 114-1 of the tire in the bead region 118. In some configurations, the electrical conductors 224 are thin conductive films (e.g., a layer of conductive material formed by using a conductive ink or polymer, or using other methods, such as electro deposition, electroplating, sputtering, or other vacuum deposition techniques). The electrical conductors 224 are configured to couple with the electrical conductors 214 of the energy-harvesting device 206 (e.g., the electrical conductors 224 are sized and/or spaced apart to match the sizes, such as a width and a length, and/or spacing of the electrical conductors 214). For example, the electrical conductors 224 may extend substantially radially (e.g., substantially parallel to a respective line extending from a center axis of the tire 202 toward the tread region of the tire 202). In some configurations, the tire 202 also includes one or more electrical conductors 226 for coupling with one or more electrical conductors 216 of the energy-harvesting device 206.

In some configurations, the energy-harvesting device 206 has only two electrical conductors 214: a first electrical conductor 214-1 for a high voltage line, and a second electrical conductor 214-2 for a low voltage line. In such configurations, the tire 202 may also have only two electrical conductors 224-1 and 224-2. In some other configurations, the energy-harvesting device 206 has more than two electrical conductors (e.g., three, four, five, six, eight, ten, twenty, or more). For example, the energy-harvesting device 206 may have multiple electrical conductors to provide high voltage and multiple electrical conductors to provide low voltage. Such configurations increase the reliability of electrical connection between the energy-harvesting device 206 and the electrical components located within the tire 202 by providing redundant electrical contacts.

Figure 2C:
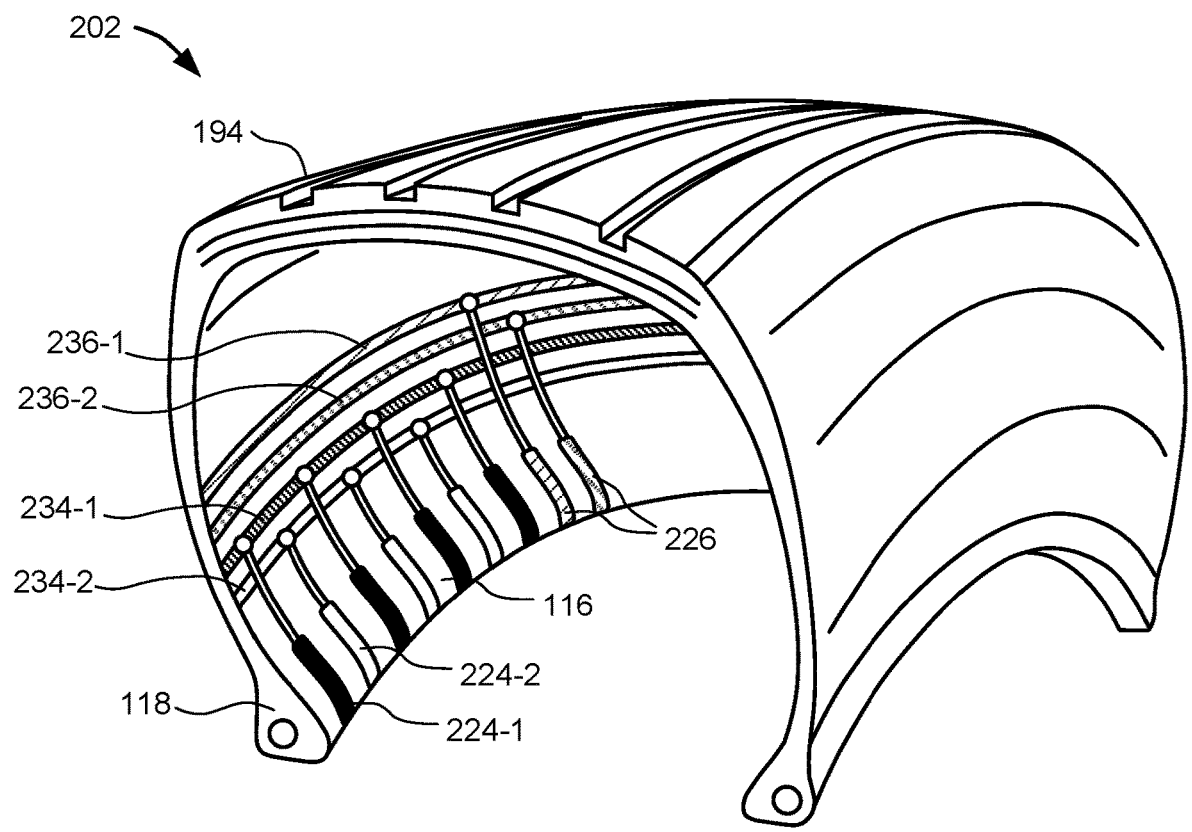
FIG. 2C shows an inner surface of the tire shown in FIG. 2B in accordance with some embodiments.

FIG. 2C shows an inner surface of the tire 202 shown in FIG. 2B in accordance with some embodiments. In FIG. 2C, the electrical conductors 224 wrap around the bead region 118 from the outer surface 114 (as shown in FIG. 2B) and extend into the inner surface 116 of the tire 202.

Figure 2D:
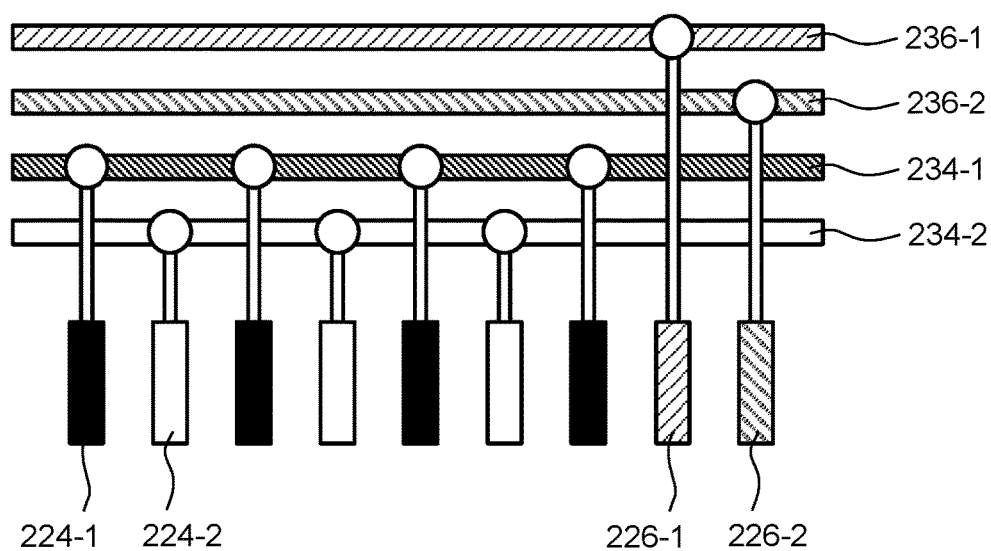
FIG. 2D is a schematic diagram illustrating electrical connection of electrical conductors in accordance with some embodiments.

FIG. 2C also shows that the electrical conductors 224 are coupled to different power bus lines formed by electrical conductors 234-1 and 234-2. Similarly, in some configurations, the electrical conductors 226 may be coupled to data bus lines formed by electrical conductors 2346-1 and 236-2. The bus lines facilitate transfer of the electrical power (or data) to different parts of the tire. For example, in configurations with only one energy-harvesting device 206, the bus lines allow delivery of electrical power to electrical components located on an opposite side of the tire 202 (e.g., when the energy-harvesting device 206 is mounted at the 12 o'clock position of a wheel, the electrical power from the energy-harvesting device 206 may be distributed to electrical components located at 6 o'clock position of the wheel, or any other rotational positions within the tire). In some configurations, the bus lines extend circumferentially (e.g., making a complete circle, or a portion thereof, along a circumference of a circle that can be drawn within the tire 202), as shown in FIG. 2C. FIG. 2D is a schematic diagram illustrating electrical connection of electrical conductors in accordance with some embodiments.

Figure 2E:
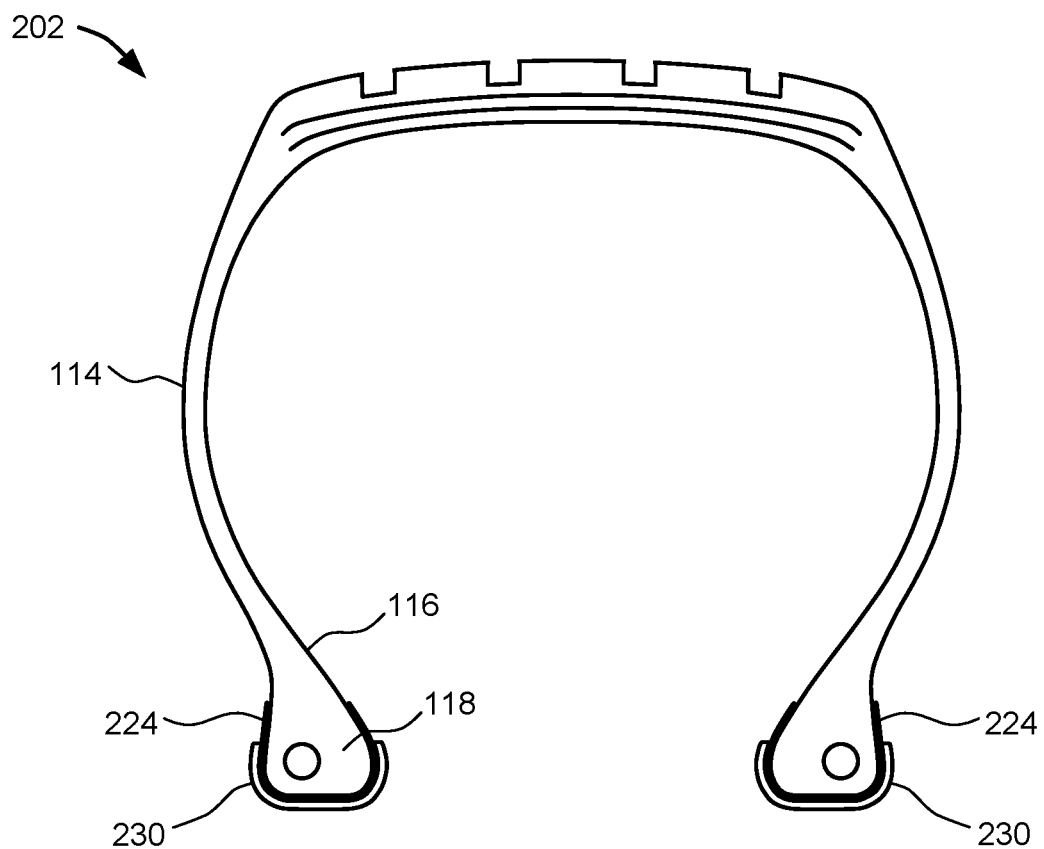
FIG. 2E shows insulating layers mounted on a tire in accordance with some embodiments.

FIG. 2E shows insulating layers 230 mounted on a tire in accordance with some embodiments. The insulating layers 230 at least partially covers the electrical conductors 224 to prevent electrical short circuits between the electrical conductors 224 when tire 202 is mounted on a wheel made of a conductive material. In addition, the insulating layers 230 provide additional mechanical protection for the electrical conductors 224, thereby prolonging the lifetime of the electrical conductors 224.

Figure 3A:
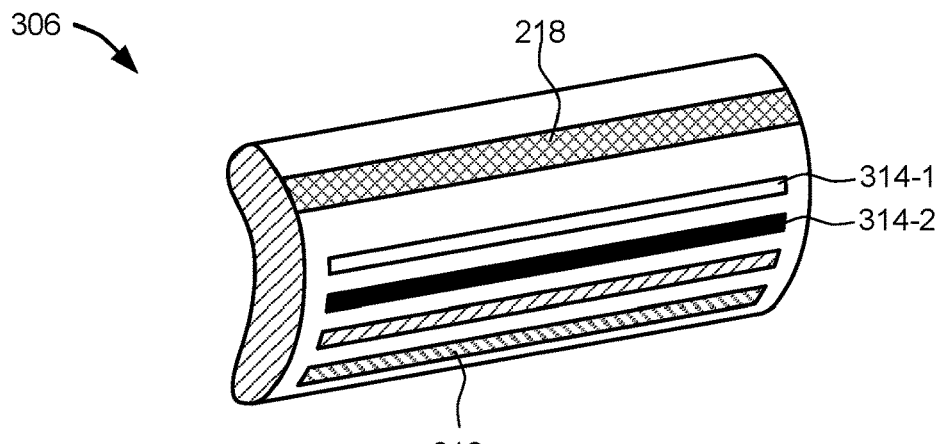
FIG. 3A shows an energy-harvesting device in accordance with some embodiments.

FIG. 3A shows an energy-harvesting device 306 in accordance with some embodiments. The energy-harvesting device 306 is similar to the energy-harvesting device 206 shown in FIG. 2A, except that the electrical conductors (including electrical conductors 314-1, 314-2, and 316) extend substantially circumferentially relative to the wheel on which the energy-harvesting device 306 is configured to be mounted.

Figure 3B:
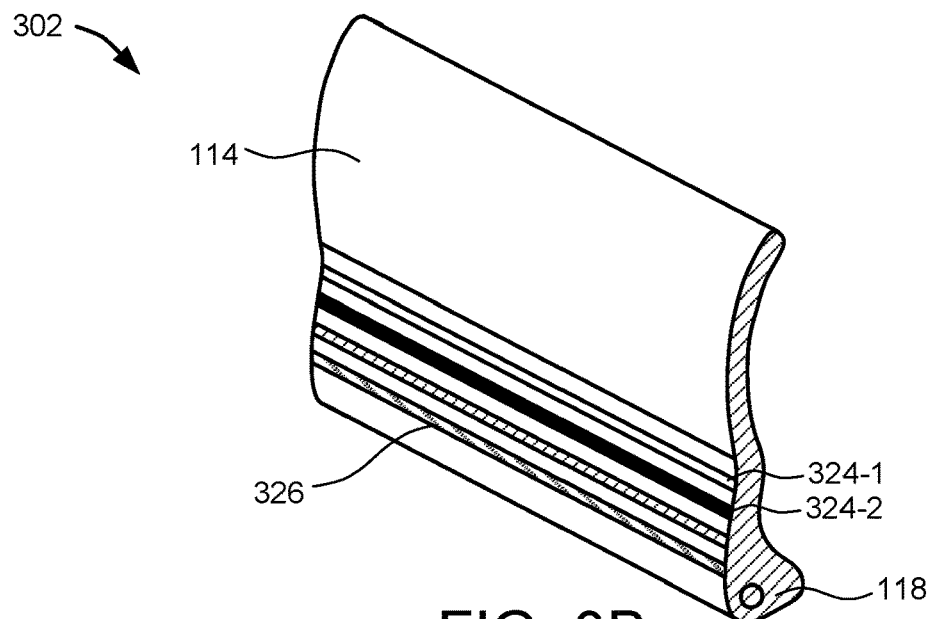
FIG. 3B shows a portion of a tire configured to couple with the energy-harvesting device shown in FIG. 3A in accordance with some embodiments.

FIG. 3B shows a portion of a tire 302 configured to couple with the energy-harvesting device 306 shown in FIG. 3A in accordance with some embodiments. The tire 302 is similar to the tire 202 shown in FIG. 2B, except that the electrical conductors (including electrical conductors 324-1, 324-2, and 326) extend substantially circumferentially (e.g., substantially perpendicular to respective lines extending from a center axis of the tire 302 toward the tread region of the tire 302).

Figure 3C:
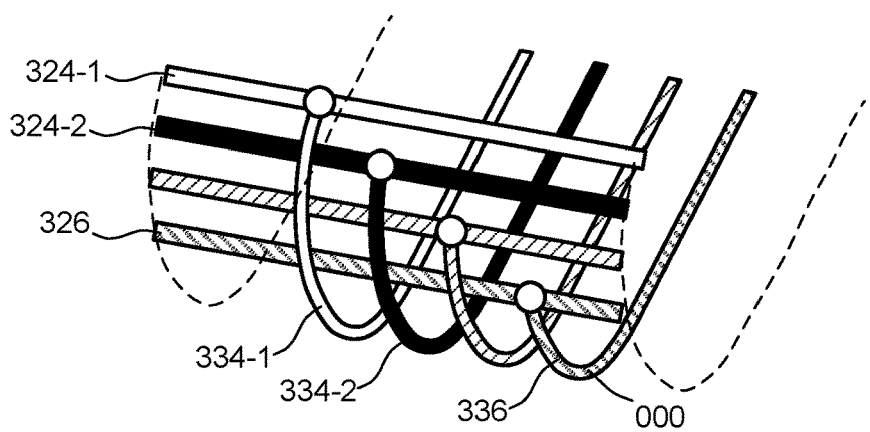
FIG. 3C shows electrical conductors extending around bead regions of a tire to couple with the electrical conductors shown in FIG. 3B in accordance with some embodiments.

Because the electrical conductors 324-1, 324-2, and 326 do not extend toward the inner surface of the tire 302, such electrical conductors are electrically coupled to another set of electrical conductors extending from the outer surface 114 of the tire 302 to an inner surface of the tire 302. FIG. 3C shows electrical conductors 334-1, 334-2, and 336 extending around bead regions of a tire from an inside surface of the tire 302 to couple with the electrical conductors shown in FIG. 3B in accordance with some embodiments. In some configurations, the electrical conductors 334-1, 334-2, and 336 are embedded within the tire 302 (e.g., the electrical conductors 334-1, 334-2, and 336 are not exposed on the outer surface 114 of the tire 302). In some other configurations, the electrical conductors 334-1, 334-2, and 336 are located on the outside surface 114 of the tire 302 and one or more insulating layers are used to prevent electrical short circuits among electrical conductors 334-1, 334-2, and 336.

Figure 4A:
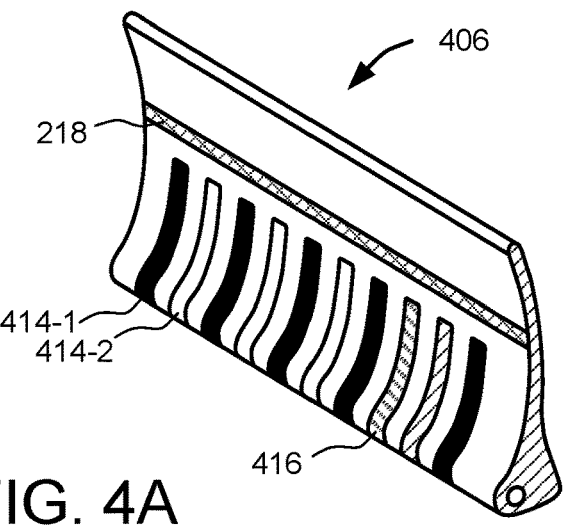
FIG. 4A shows an energy-harvesting device in accordance with some embodiments.

FIG. 4A shows an energy-harvesting device 406 in accordance with some embodiments. The energy-harvesting device 406 is similar to the energy-harvesting device 206 shown in FIG. 2A, except that electrical conductors 414-1, 414-2, and 416 are located on a concave surface of the energy-harvesting device 406 (configured to face the rim lip of the wheel).

Figure 4B:
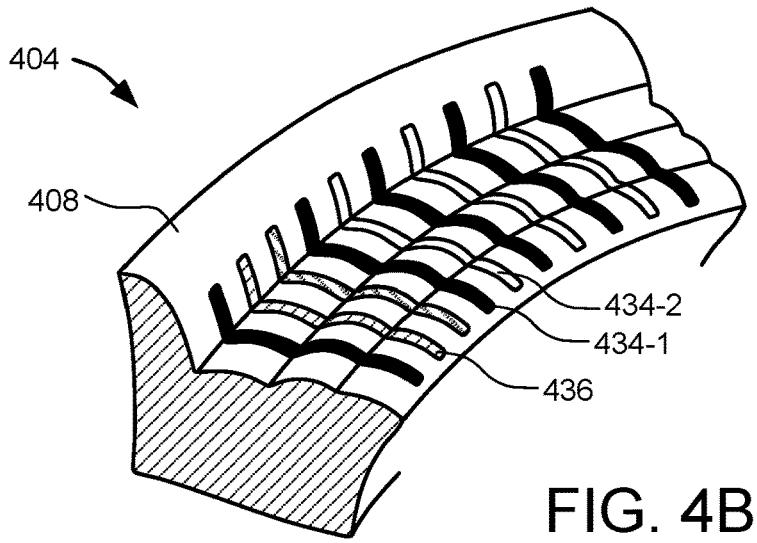
FIG. 4B shows a rim region of a wheel configured to couple with the energy-harvesting device shown in FIG. 4A in accordance with some embodiments.

Because the electrical conductors 414-1, 414-2, and 416 do not face toward the tire, connecting electrical conductors are used to allow electrical connection between the electrical conductors 414-1, 414-2, and 416 to electrical components located on an inside surface of a tire. FIG. 4B shows a rim region 408 of a wheel 404 configured to couple with the energy-harvesting device 406 shown in FIG. 4A in accordance with some embodiments. The rim region 408 of the wheel 404 includes a plurality of electrical conductors, such as electrical conductors 434-1, 434-2, and 436. The electrical conductors 434-1, 434-2, and 436 are configured (e.g., sized and/or spaced apart) to electrically couple with the electrical conductors 414-1, 414-2, and 416 of the energy-harvesting device 406 when the energy-harvesting device 406 is mounted on the wheel 404.

Figure 4C:
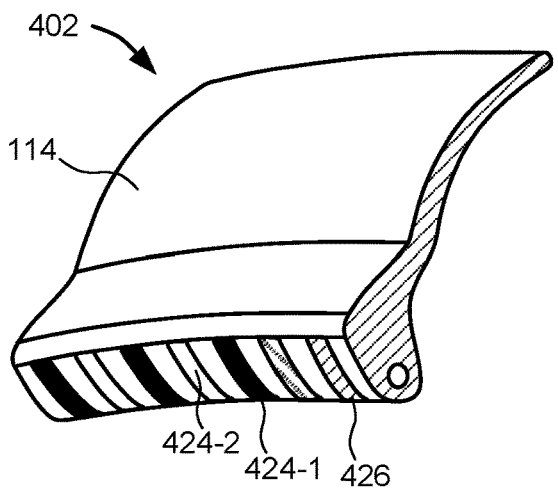
FIG. 4C shows a portion of a tire configured to couple with the energy-harvesting device shown in FIG. 4A and the wheel shown in FIG. 4B in accordance with some embodiments.
Figure 4D:
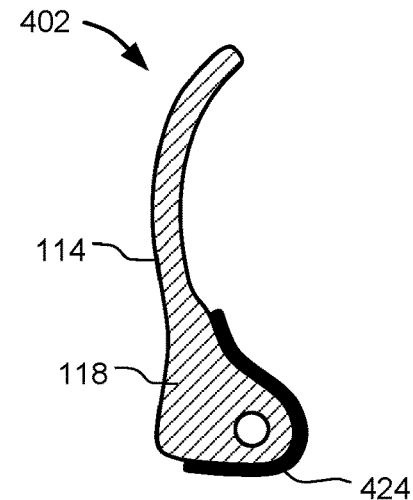
FIG. 4D is a cross sectional view of the tire shown in FIG. 4C in accordance with some embodiments.

FIG. 4C shows a portion of a tire 402 configured to couple with the energy-harvesting device 406 shown in FIG. 4A and the wheel 404 shown in FIG. 4B in accordance with some embodiments. Because the electrical conductors 414-1, 414-2, and 416 do not face toward the tire 402, electrical conductors 424-1, 424-2, and 426 of the tire 402 need not extend to the outer surface 114 of the tire 402. Thus, as shown in FIG. 4D, in some configurations, the electrical conductors 424-1, 424-2, and 426 of the tire 402 extend only to the bead region 118 without extending to the outer surface 114 of the tire 402. Such configurations avoids damages to the electrical conductors 424-1, 424-2, and 426 caused by contaminants trapped between the energy-harvesting device 406 and the tire 402, thereby prolonging the lifetime of the electrical conductors 424-1, 424-2, and 426. The electrical conductors 424-1, 424-2, and 426 of the tire 402 are configured (e.g., sized and/or spaced apart) to electrically couple with the electrical conductors 434-1, 434-2, and 436 of the wheel 404.

Figure 5A:
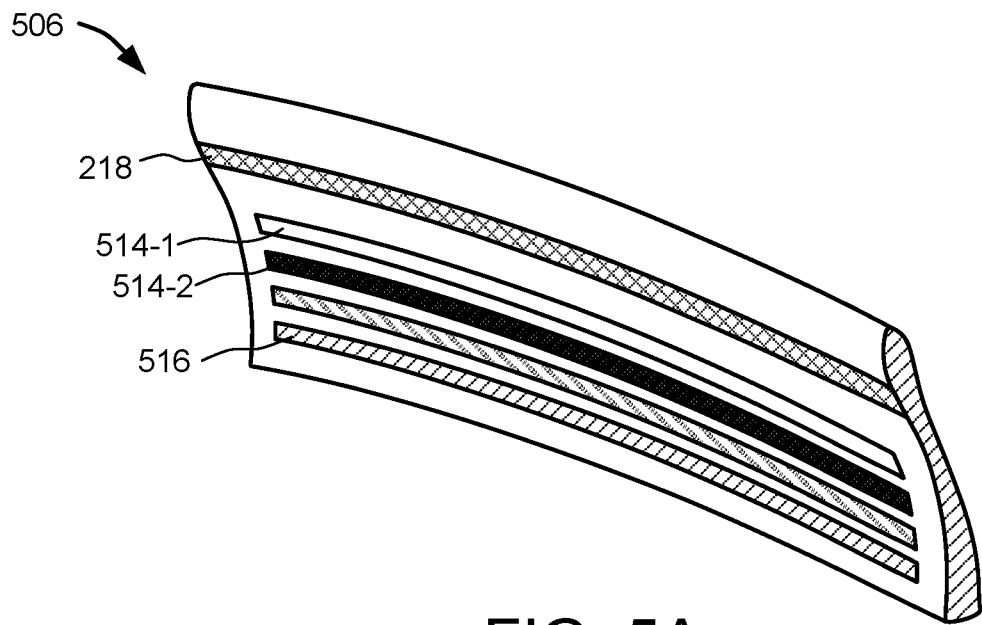
FIG. 5A shows an energy-harvesting device in accordance with some embodiments.

FIG. 5A shows an energy-harvesting device 506 in accordance with some embodiments. The energy-harvesting device 506 is similar to the energy-harvesting device 406 shown in FIG. 4A, except that the electrical conductors (including electrical conductors 514-1, 514-2, and 516) extend substantially circumferentially relative to the wheel on which the energy-harvesting device 506 is configured to be mounted.

Figure 5B:
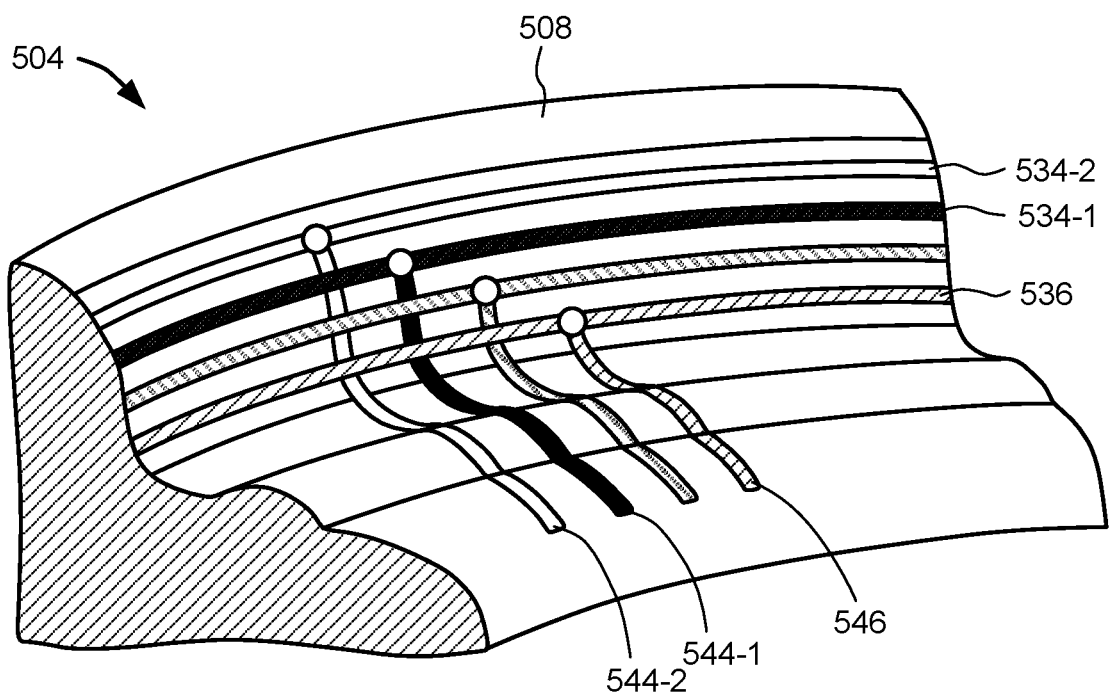
FIG. 5B shows a rim region of a wheel configured to couple with the energy-harvesting device shown in FIG. 5A in accordance with some embodiments.

FIG. 5B shows a rim region of a wheel 504 configured to couple with the energy-harvesting device 506 shown in FIG. 5A in accordance with some embodiments. The wheel 504 is similar to the wheel 404 shown in FIG. 4B, except that the electrical conductors (including electrical conductors 534-1, 534-2, and 536) extend substantially circumferentially.

Because the electrical conductors 534-1, 534-2, and 536 do not extend toward the tire mounted on the wheel 504, such electrical conductors are electrically coupled to another set of electrical conductors extending toward the tire, such as electrical conductors 544-1, 544-2, and 546. In some configurations, the electrical conductors 544-1, 544-2, and 336 are partly embedded within the wheel 504 (e.g., portions of the electrical conductors 544-1, 544-2, and 336 are not exposed on an outside surface of the wheel 504) to prevent electrical short circuits between the electrical conductors. In some other configurations, the electrical conductors 544-1, 544-2, and 336 are located on the outside surface of the wheel 504 as shown in FIG. 5B and one or more insulating layers are used to prevent electrical short circuits among electrical conductors 544-1, 544-2, and 336.

Although FIGS. 2A-2E, 3A-3C, 4A-4D, and 5A-5B show electrical conductors extending to an inner side wall of a tire, in some configurations, one or more electrical conductors may extend to a tread region 194 of a tire (e.g., along the inner surface 116 of the tire). This allows electrical coupling with one or more electrical components (e.g., sensors) located in the tread region 194, which, in turn, allows the electrical components positioned (e.g., surface mounted or embedded) in the tread region 194 to receive electrical power and/or provide data through the electrical conductors.

Figure 6B:
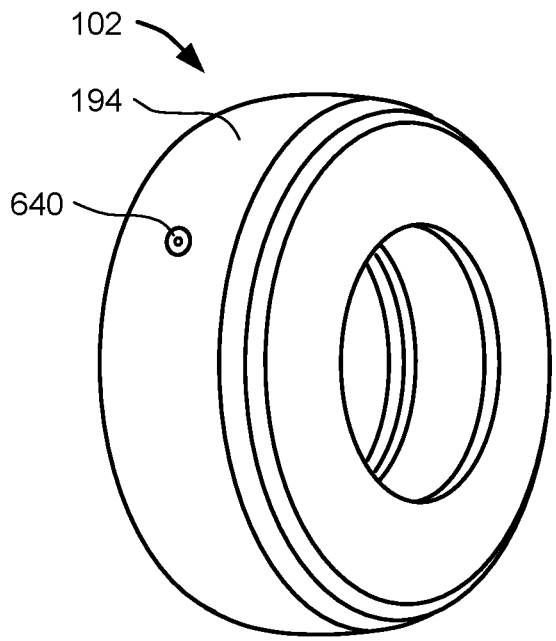
FIG. 6B illustrates the stub shown in FIG. 6A embedded on a tread surface of a tire in accordance with some embodiments.
Figure 6A:
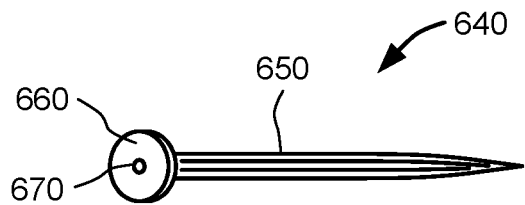
FIG. 6A illustrates an electrical connector assembly having a shape of a stub in accordance with some embodiments.

FIG. 6A illustrates an electrical connector assembly 640 having a shape of a stub in accordance with some embodiments. The sub 640 has a post portion 650 and a head 660, and includes one or more electrical conductors 670 that extend length-wise along the post portion 650. In some configurations, the post portion 650 has a length between 20 mm and 200 mm. However, the post portion 650 may have a different length, depending on a thickness of a wall of the tire on which the stub 640 is to be mounted. In some configurations, the post portion 650 has a pointy end (e.g., the post portion 650 may have a shape of a needle). In some other configurations, the post portion 650 has a blunt end without a pointy end. In some configurations, the stub 640 may be embedded on a tread region 194 of a tire 102 as shown in FIG. 6B.

Figure 6C:
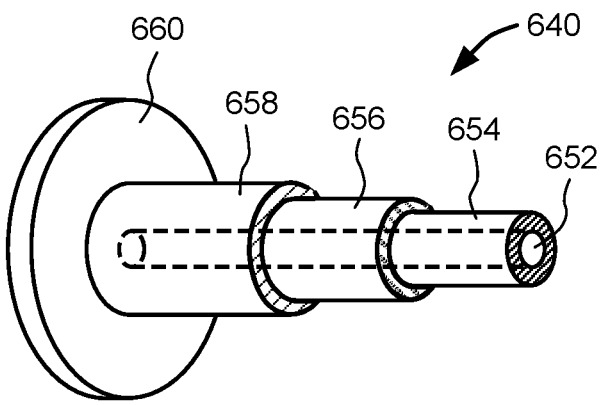
FIG. 6C is a schematic diagram illustrating a coaxial configuration of the stub shown in FIG. 6A in accordance with some embodiments.
Figure 6D:
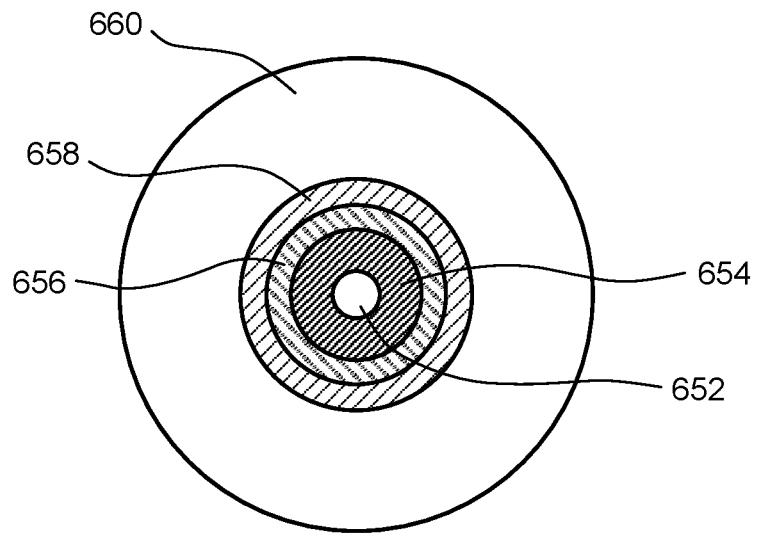
FIG. 6D is a front elevational view of the head of the stub shown in FIG. 6C.

In some configurations, the stub 640 includes two or more electrical conductors that are electrically isolated from each other. In some configurations, the two or more electrical conductors are electrically isolated from each other. For example, as shown in FIG. 6C, electrical conductors 652 and 656 have a coaxial configuration, in which electrical conductors 652 and 656 are separated by an electrical isolator 654. In some configurations, the electrical conductor 656 has a shape of a sheet that wraps around the electrical isolator 654. In some configurations, an electrical isolator 658 wraps around the electrical conductor 656 to protect the electrical conductor 656. FIG. 6D is a front elevational view of the head 660 of the stub 640 showing the coaxial configuration.

Figure 6E:
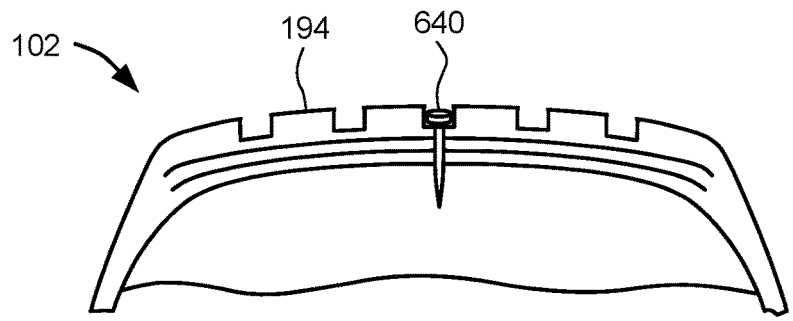
FIG. 6E and FIG. 6F show example locations on a tire for embedding a stub in accordance with some embodiments.
Figure 6F:
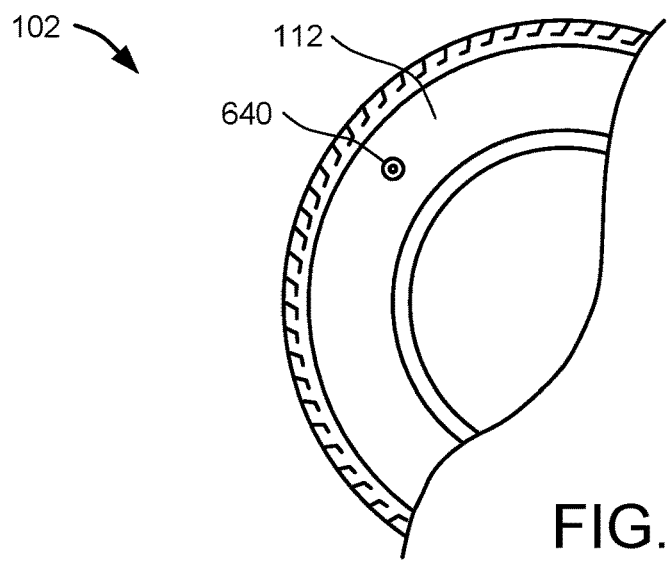

The stub 640 may be mounted in the tread region as shown in FIG. 6E or on a side wall as shown in FIG. 6F.

Figure 6G:
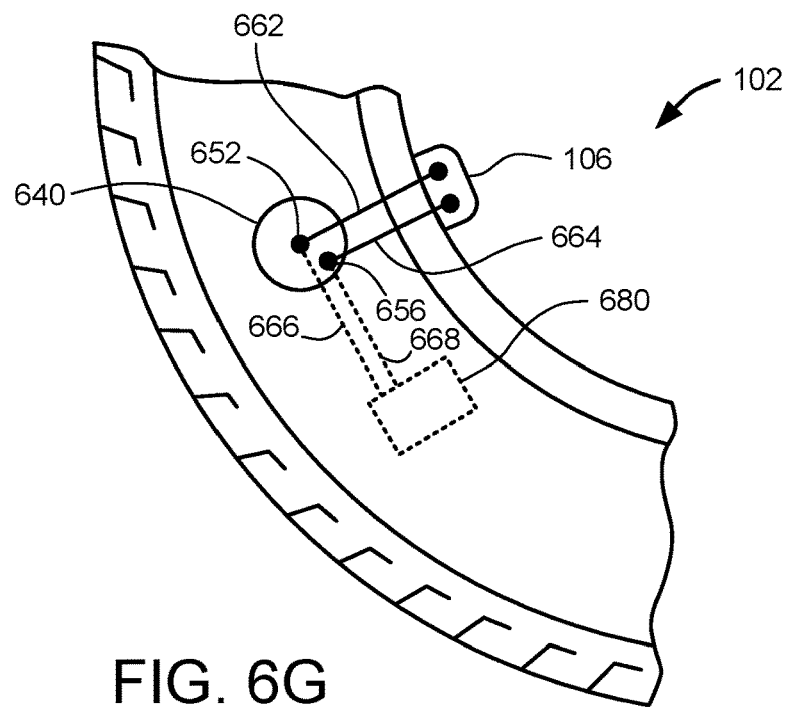
FIG. 6G is a schematic diagram illustrating electrical connections between an energy-harvesting device and an electrical component located inside a tire in accordance with some embodiments.

FIG. 6G is a schematic diagram illustrating electrical connections between an energy-harvesting device 106 and an electrical component 680 (e.g., a sensor) located inside a tire 102 in accordance with some embodiments. The energy-harvesting device 106 mounted on a wheel is electrically coupled to electrodes 652 and 656 of the stub 640 via electrical conductors 662 and 664 (e.g., wires) located outside the tire 102. The electrical conductors 652 and 656 are electrically coupled with the electrical component 680 located inside the tire 102 via electrical conductors 666 and 668 (e.g., wires) located inside the tire 102.

Figure 6H:
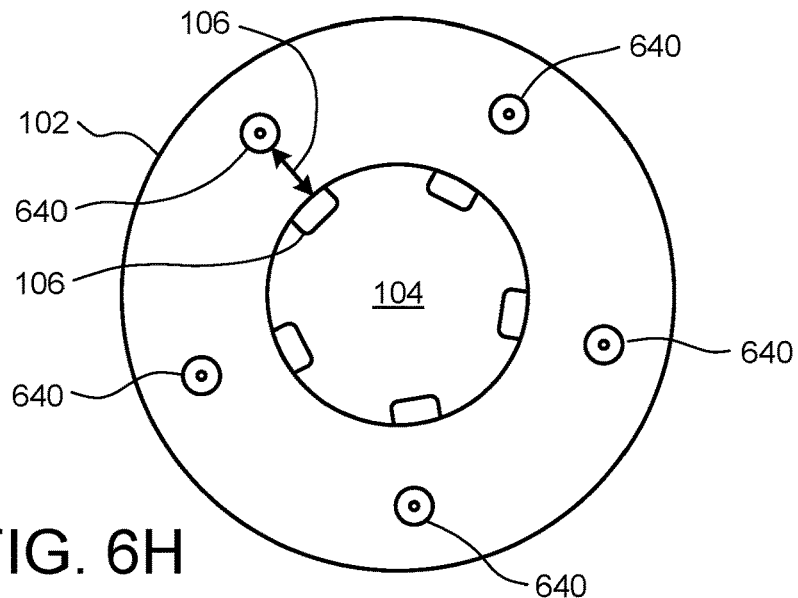
FIG. 6H illustrates an arrangement of multiple energy-harvesting devices and multiple stubs in accordance with some embodiments.

FIG. 6H illustrates an arrangement of multiple energy-harvesting devices 106 and multiple stubs in accordance with some embodiments. Shown in FIG. 6H is a wheel assembly including a wheel and a tire 102. A plurality of energy-harvesting devices 106 are mounted along a rim of the wheel 104, and multiple stubs 640 are embedded on a side wall of the tire 102. In some configurations, a distance between an energy-harvesting device 106 and an adjacent stub 640 is between 10 mm and 50 mm. In some configurations, the energy-harvesting devices 106 are arranged with an equal angular displacement. In some other configurations, the energy-harvesting devices 106 are arranged with different angular displacements.

Figure 6I:
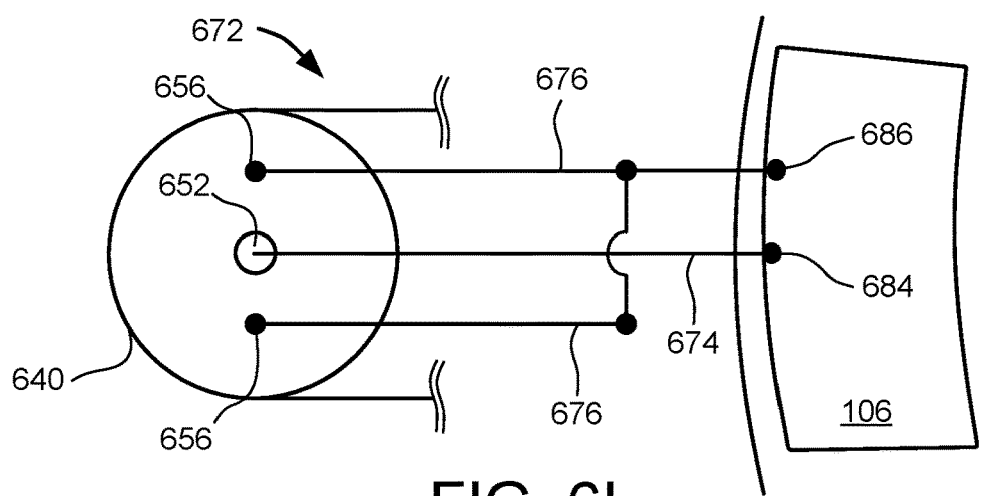
FIG. 6I is a schematic diagram illustrating a flex cable extending from a stub to an energy-harvesting device in accordance with some embodiments.

FIG. 6I is a schematic diagram illustrating a flex cable 672 extending from a stub 640 to an energy-harvesting device 106 in accordance with some embodiments. The flex cable 672 includes electrical conductors 674 and 676 (e.g., wires) for electrically connecting the electrical conductors 652 and 656 of the stub 640 to electrodes 684 and 686 of the energy-harvesting device 106. In some configurations, the stub 640 has two or more wire-shaped electrical conductors 656 instead of an electrical conductor sheet as shown in FIG. 6C, and the flex cable 672 may include two or more electrical conductors for providing high voltage (or low voltage).

Figure 6J:
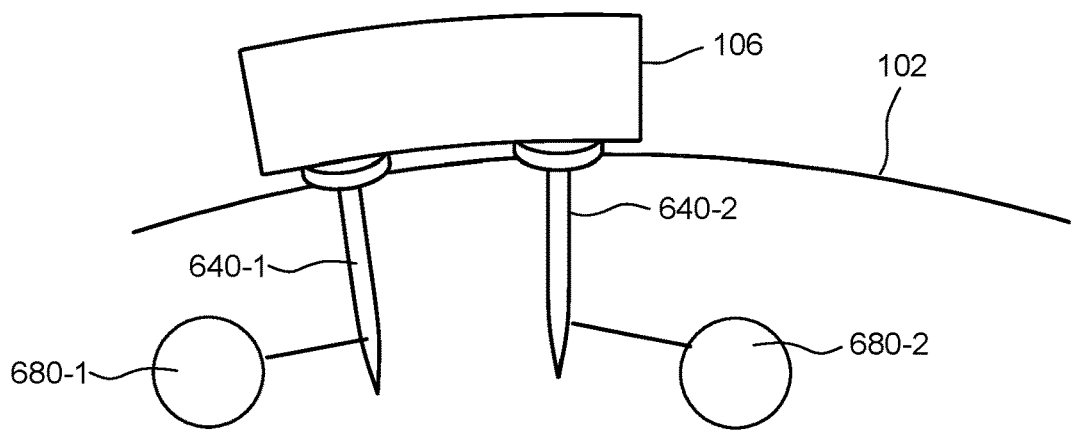
FIG. 6J is a schematic diagram illustrating an energy-harvesting device coupled with two or more stubs in accordance with some embodiments.

FIG. 6J is a schematic diagram illustrating an energy-harvesting device 106 coupled with two or more stubs 640, including stubs 640-1 and 640-2, in accordance with some embodiments. A separate stub is coupled with a separate electrical component (e.g., a stub 640-1 is coupled with an electrical component 680-1 and a stub 640-2 is coupled with an electrical component 680-2).

Figure 7A:
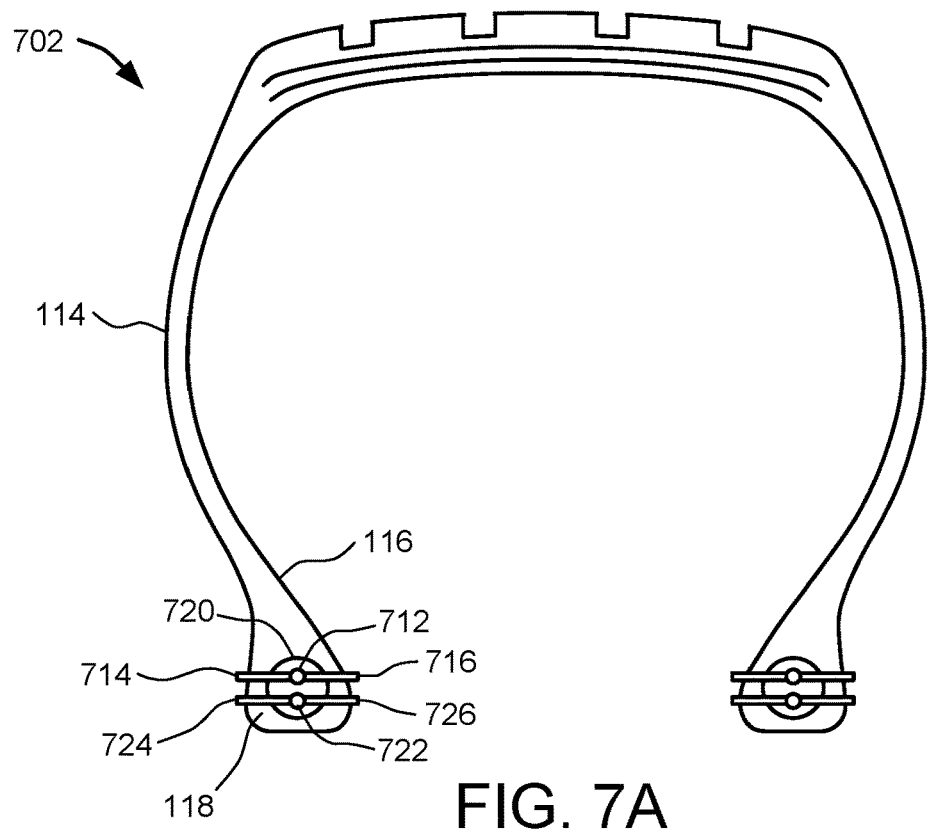
FIG. 7A is a cross-sectional view of a tire with embedded conductors in accordance with some embodiments.
Figure 7B:
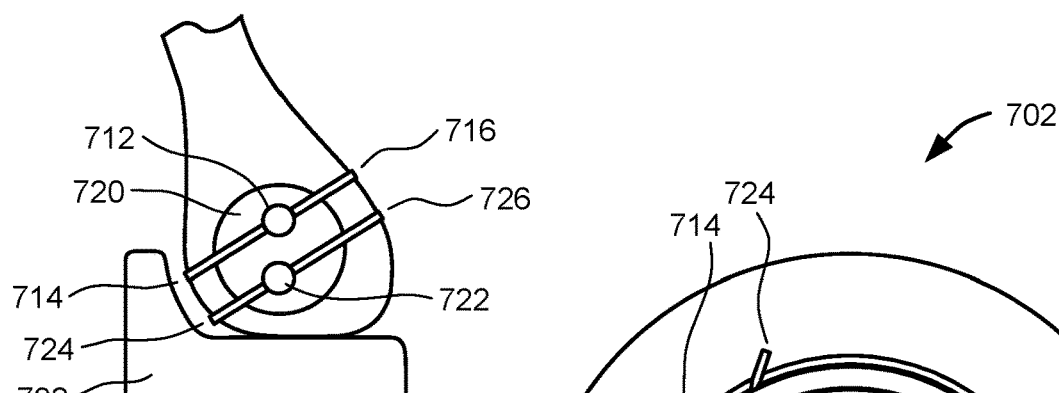
FIG. 7B is a cross-sectional view of a bead portion of a tire in contact with a rim in accordance with some embodiments.

FIG. 7A is a cross-sectional view of a tire 702 with embedded conductors in accordance with some embodiments. The tire 702 is similar to the tire 102 except that one or more bead wires 712 and 722 embedded within the bead region 118 of the tire 702 are electrically coupled with additional electrical conductors 714, 716, 724, and 726 that extend to an outside surface 114 and/or an inner surface 116. The bead wires 712 and 722 are made of a conductive material, and thus, allow conduction of electrical power (or electrical signals). FIG. 7B is a cross-sectional view of the bead portion 118 of the tire 702 in contact with a rim 708 in accordance with some embodiments. The orientation of the electrical conductors 714, 716, 724, and 726 may vary. For example, in some configurations, the electrical conductors 714, 716, 724, or 726 are not in contact with the rim 708 (e.g., only the non-conductive portions of the tire 702 are in contact with the rim 708).

Figure 7C:
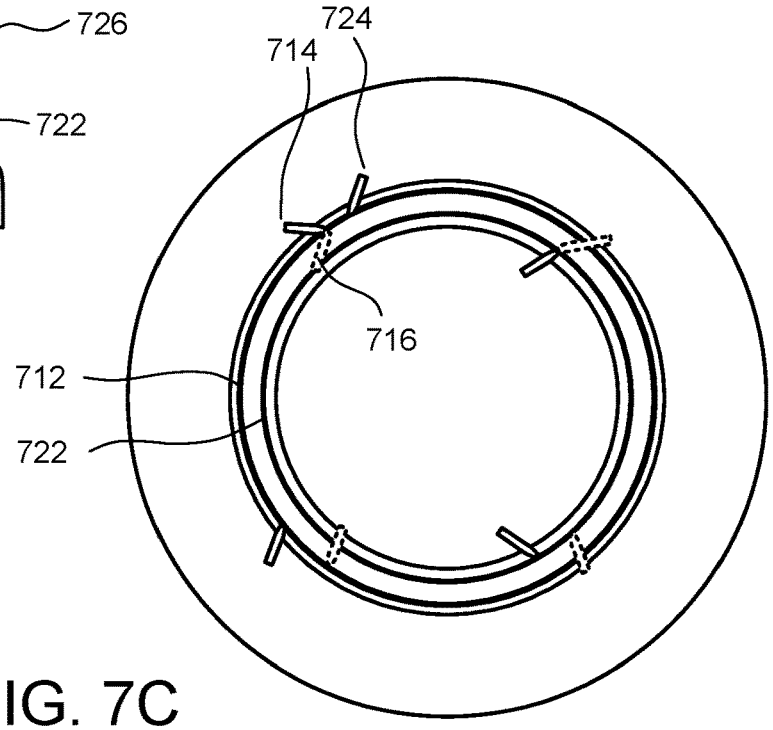
FIG. 7C is a front elevational view of a tire with conductive rings in accordance with some embodiments.

FIG. 7C is a front elevational view of a tire with conductive rings in accordance with some embodiments. In FIG. 7C, each of the bead wires 712 and 722 has a shape of a ring, thereby forming a loop. In some implementations, at least one of the bead wires 712 and 722 has a shape of a portion, less than the entirety, of a ring (e.g., a semi-circle or an arc). Although the bead wires 712 and 722 are embedded in the tire 702, the bead wires 712 and 722 are illustrated with solid lines in FIG. 7C for clarity.

Figure 8A:
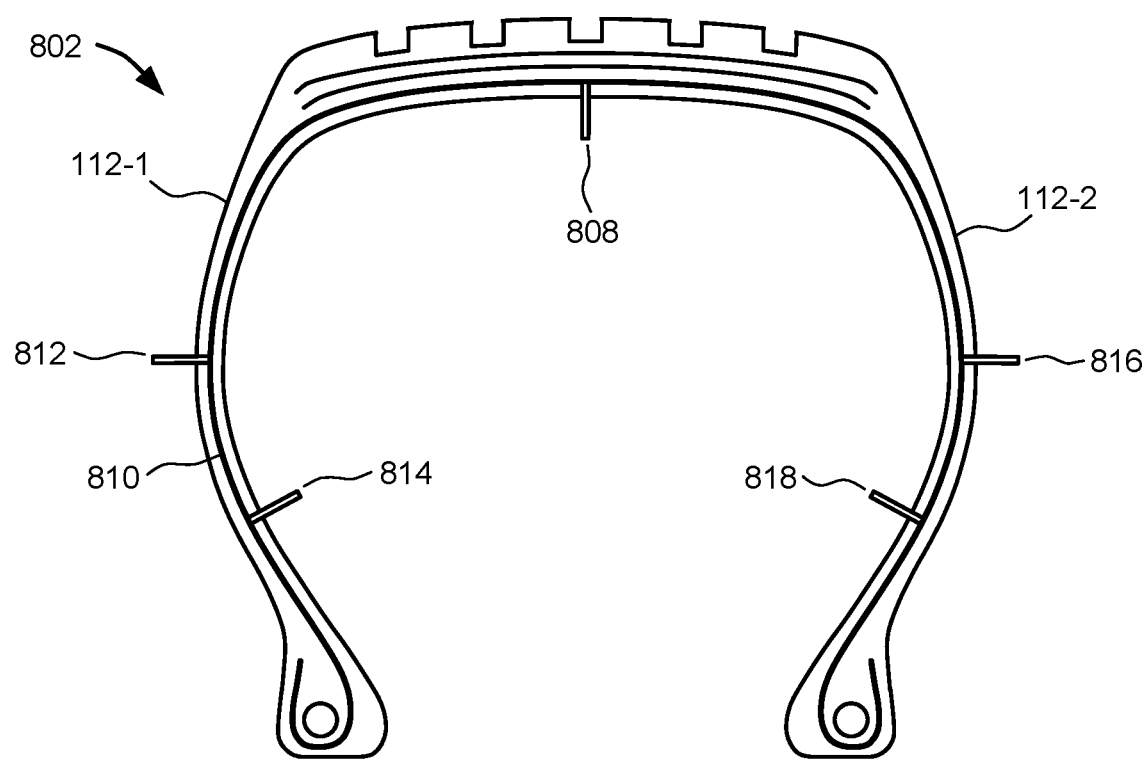
FIG. 8A is a cross-sectional view of a tire with an embedded conductor in accordance with some embodiments.

FIG. 8A is a cross-sectional view of a tire 802 with an embedded conductor 810 in accordance with some embodiments. In FIG. 8A, the embedded electrical conductor 810 extends from a bead area of the outer side wall 112-1 to a bead area of the inner side wall 112-2. The embedded conductor 810 is coupled with electrical conductors 808, 812, 814, 816, and 818 that extend toward an outside surface and/or an inside surface of the tire 802. The embedded electrical conductor 810 is made of a solid material (e.g., conductive metal).

Figure 8B:
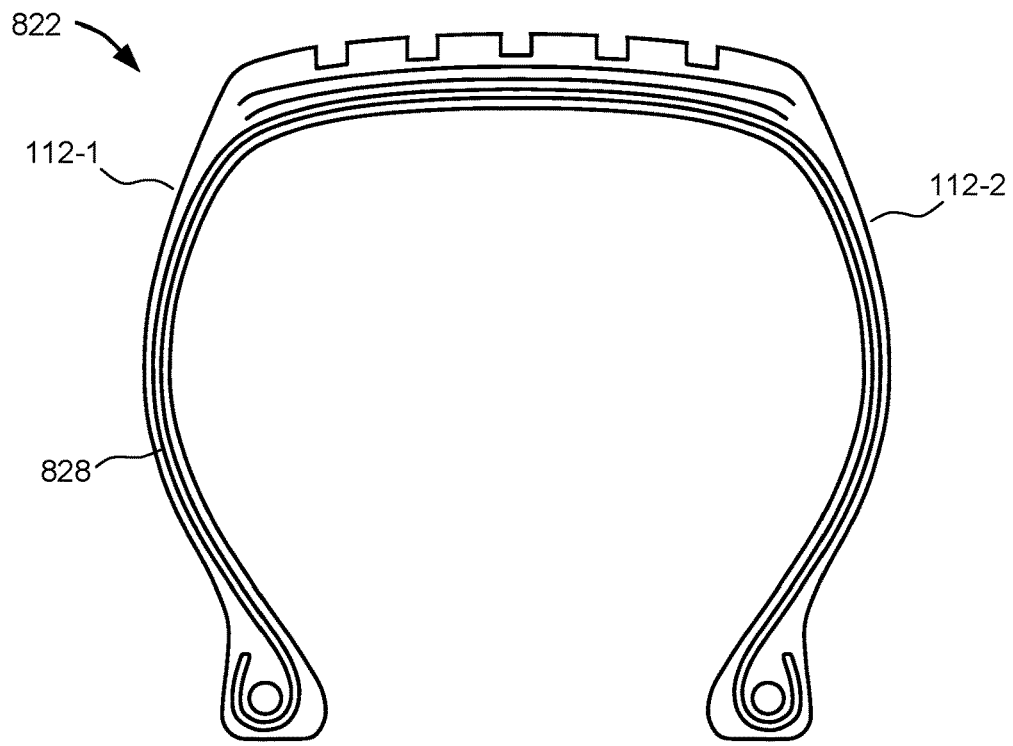
FIGS. 8B and 8C are cross-sectional views of a tire with a hollow channel in accordance with some embodiments.
Figure 8C:
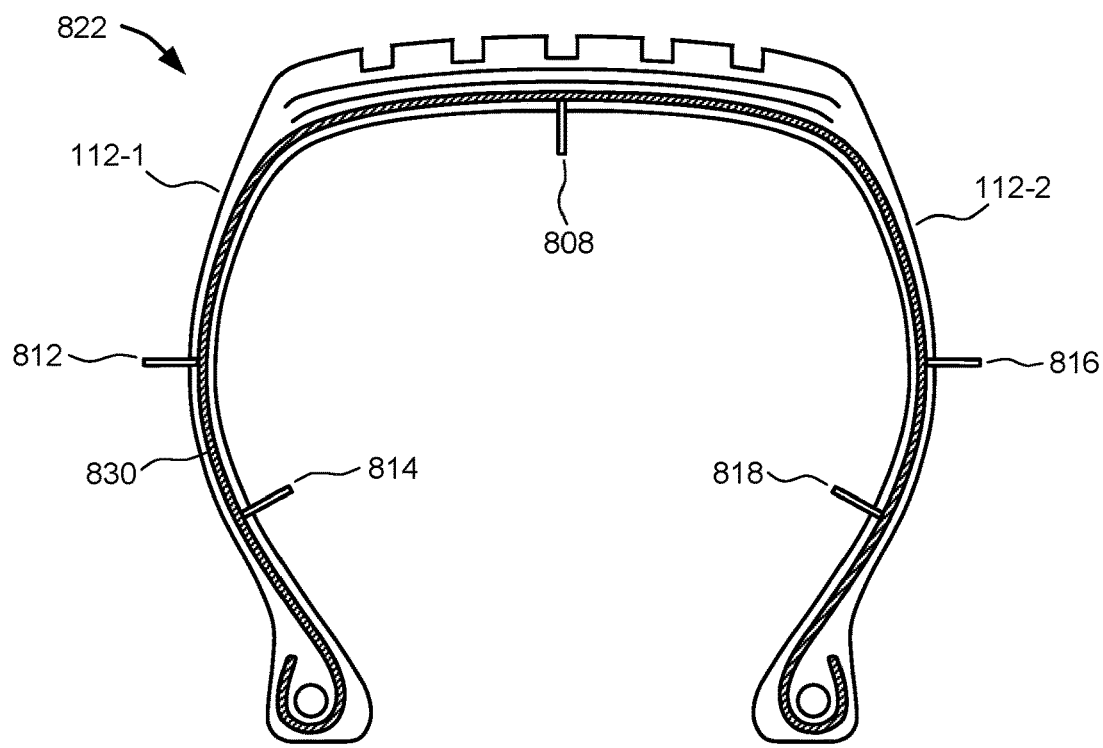

FIGS. 8B and 8C are cross-sectional views of a tire 822 in accordance with some embodiments. The tire 822 is similar to the tire 802, except that the tire 822 includes liquid metal instead of a solid material. As shown in FIG. 8B, the tire 822 has a hollow channel 828 extending from a bead area of the outer side wall 112-1 to a bead area of the inner side wall 112-2, and as shown in FIG. 8C, the hollow channel 828 is filled with liquid metal 830. The liquid metal 830 is coupled with electrical conductors 808, 812, 814, 816, and 818 that extend toward an outside surface and/or an inside surface of the tire 802.

Figure 9A:
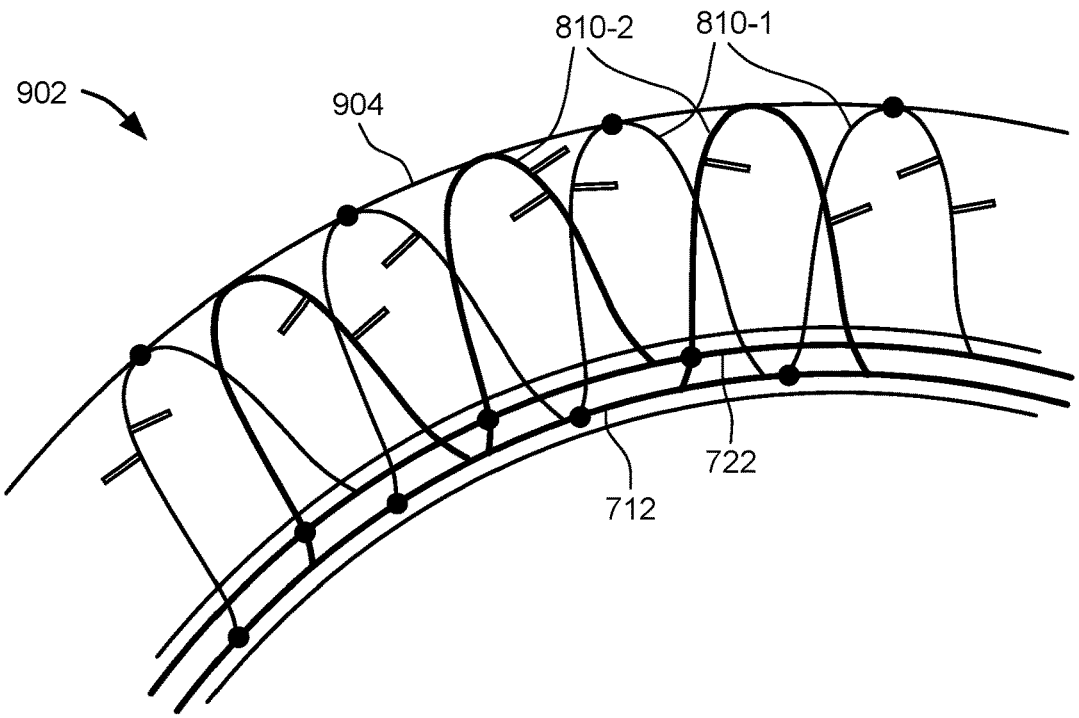
FIG. 9A is a schematic diagram illustrating multiple loops electrically coupled with conductive rings in accordance with some embodiments.

FIG. 9A is a schematic diagram illustrating an electrical connector assembly 902 with multiple loops 810 electrically coupled with conductive rings 712 and 722 in accordance with some embodiments. In FIG. 9A, a first set of loops 810-1 is coupled with the conductive ring 712 and a second set of loops 810-2 is coupled with a conductive ring 722. In some configurations, the electrical connector assembly 902 has the conductive rings only in one or more bead regions of a tire (e.g., conductive rings 712 and 722 without conductive ring 904). In some configurations, the electrical connector assembly 902 has at least one conductive ring (e.g., conductive ring 722) in a bead region of a tire and at least one conductive ring (e.g., conductive ring 904) in a tread region of the tire. In some configurations, the electrical connector assembly 902 has three or more conductive rings (e.g., conductive rings 712, 722, and 904), and at least one of the first set of loops 810-1 or the second set of loops 810-2 is electrically coupled to two or more conductive rings (e.g., the first set of loops 810-1 is electrically coupled to conductive rings 712 and 904).

Figure 9B:
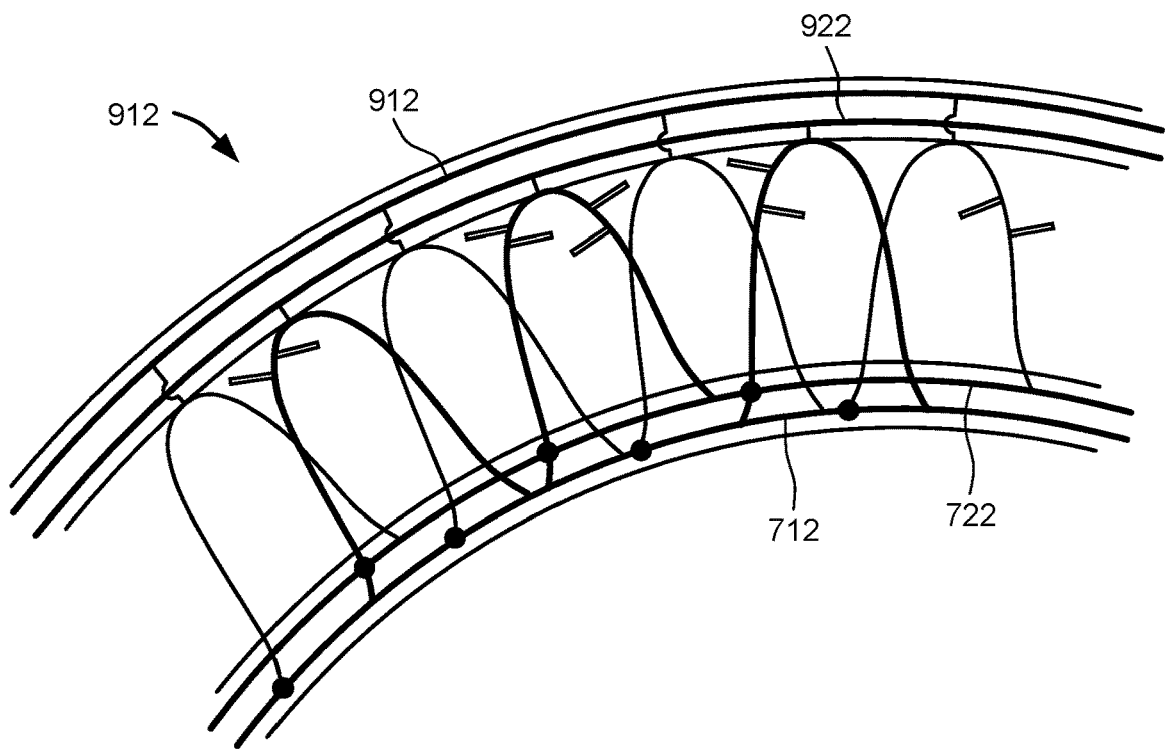
FIG. 9B is a schematic diagram illustrating multiple loops electrically coupled with conductive rings and conductive belts in accordance with some embodiments.

FIG. 9B is a schematic diagram illustrating an electrical connector assembly 912 in accordance with some embodiments. The electrical connector assembly 912 is similar to the electrical connector assembly 902, except that the electrical connector assembly includes one or more conductive belts (e.g., conductive belts 912 and 922). The one or more conductive belts 912 and 922 may correspond to steel belts of a tire).

Figure 10A:
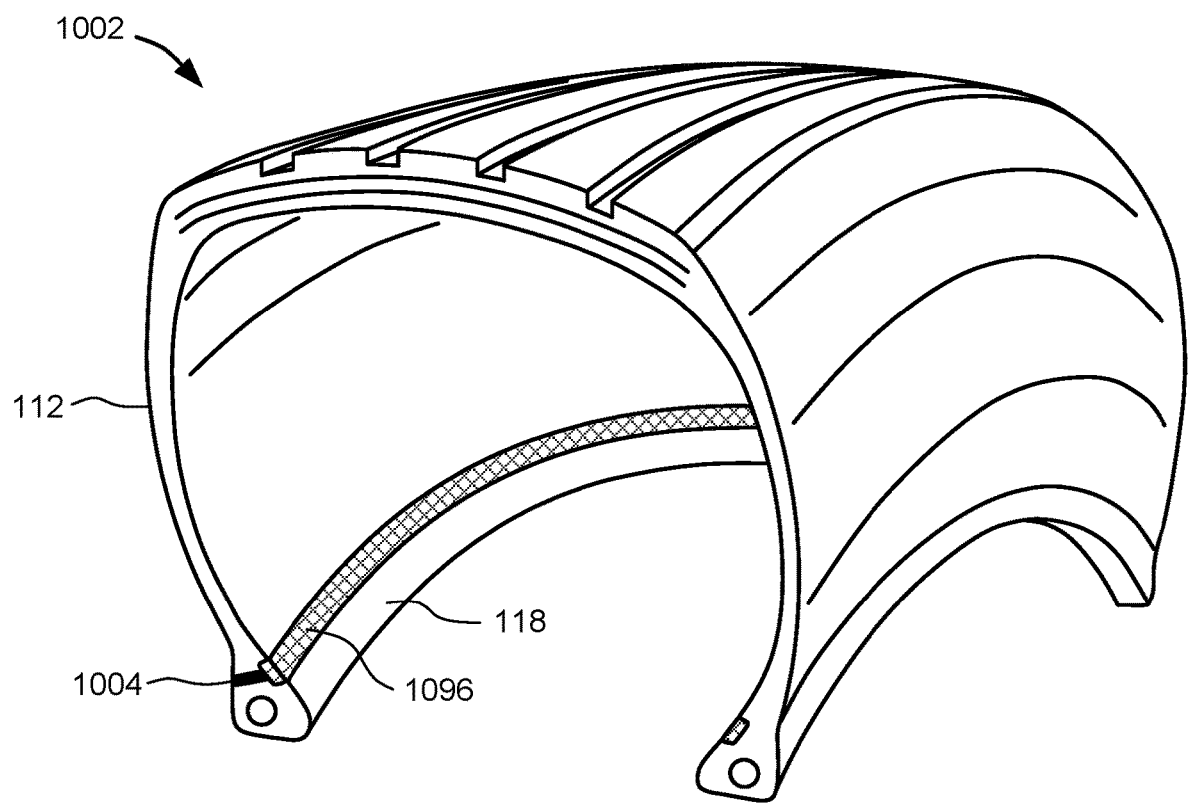
FIG. 10A is a partial cross-sectional view of a tire with a conductive plug in accordance with some embodiments.

FIG. 10A is a partial cross-sectional view of a tire 1002 with a conductive plug 1004 in accordance with some embodiments. The conductive plug 1004 may be made of a conductive polymer or conductive rubber. The conductive plug 1004 provides electrical conduction while maintaining the side wall 112 of the tire 1002 airtight. In some configurations, the conductive plug 1004 bonds permanently to the side wall 112 (e.g., using adhesives). In some configurations, the tire 1002 also includes an electrical connection strip 1096 electrically coupled to the conductive plug 1004. Similar to the bus lines shown in FIG. 2C, the electrical connection strip 1096 distributes electrical power or data to other parts of the tire 1002.

Figure 10B:
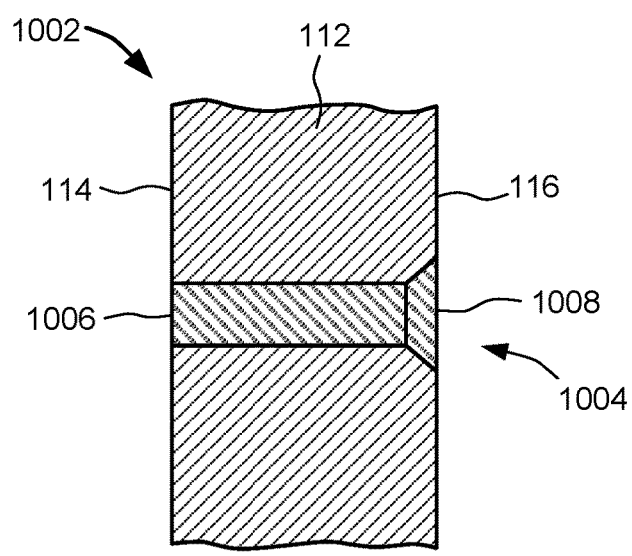
FIG. 10B is a cross-sectional view of a side wall with a conductive plug in accordance with some embodiments.

FIG. 10B is a cross-sectional view of a side wall 112 with a conductive plug 1004 in accordance with some embodiments. The conductive plug 1004 shown in FIG. 10B has a conductive shaft 1006 and a conductive head 1008. Electrical components positioned on an outer surface 114 of the side wall 112 may connect directly to the conductive shaft 1006, and electrical components positioned on an inner surface 116 of the side wall 112 may connect directly to the conductive head 1008. The conductive head 1008 is positioned on the inner surface 116 to reduce or eliminate air leakage through a gap between the conductive shaft 1006 and the side wall 112. The conductive shaft 1006 (and the conductive head 1008) may be made with a conductive polymer or conductive rubber with mechanical and thermal properties comparable to the mechanical and thermal properties of the side wall 112 so that there is no excessive stress or strain at the interface between the conductive material (e.g., the conductive shaft 1006 or the conductive head 1008) and the side wall 112 when mechanical force is applied or when the temperature of the side wall 112 and the conductive plug changes.

Figure 11A:
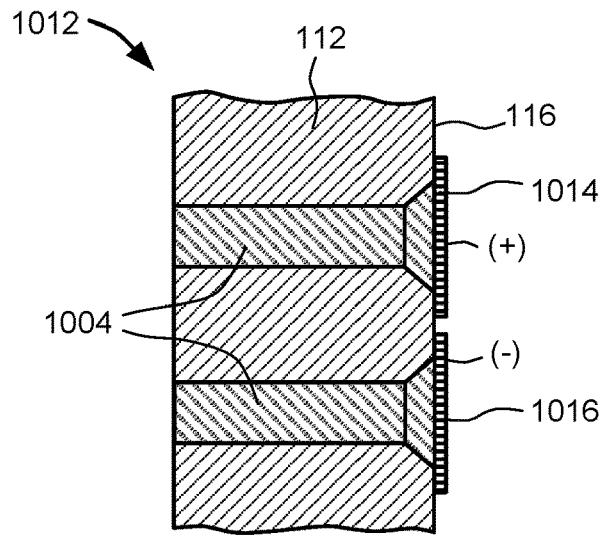
FIG. 11A is a cross-sectional view of a side wall with two conductive plugs in accordance with some embodiments.

FIG. 11A is a cross-sectional view of a side wall with two conductive plugs 1004 in accordance with some embodiments. The conductive plugs 1004 are coupled with conductive strips 1014 and 1016 (e.g., made of conductive polymer or conductive metal). In some configurations, the conductive strips 1014 and 1016 are conductive metallic strips or conductive polymer strips, which may be attached to the inner surface 116 of the side wall 112. Conductive strips 1014 and 1016 operates as bus lines, to distribute electrical power and/or data to other parts of the tire 1012.

Figure 11B:
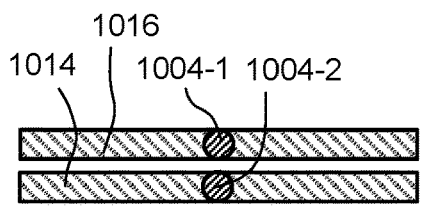
FIG. 11B is a schematic diagram illustrating electrical connection strips with two conductive plugs in accordance with some embodiments.

FIG. 11B is a schematic diagram illustrating a plan view of the electrical connection strips 1014 and 1016 and two conductive plugs 1004 (including conductive plugs 1004-1 and 1004-2) in accordance with some embodiments. Conductive strips 1014 and 1016 are physically separated from each other. Because the side wall 112 is made of an electrically insulating material (e.g., rubber), conductive strips 1014 and 1016 remain electrically isolated from each other.

Figure 11C:
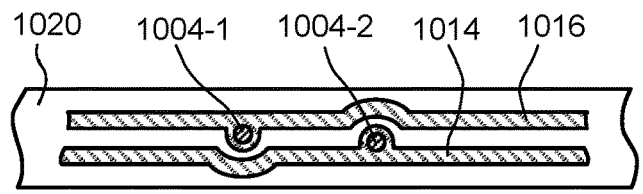
FIG. 11C is a schematic diagram illustrating electrical connection strips on an insulator substrate strip in accordance with some embodiments.

FIG. 11C is a schematic diagram illustrating electrical connection strips 1014 and 1016 on an insulator substrate strip 1020 in accordance with some embodiments. Because the electrical connection strips 1014 and 1016 are attached on the insulator substrate strip 1020, mounting the electrical connection strips 1014 and 1016 can be achieved by mounting the insulator substrate strip 1020, thereby facilitating the attachment of the electrical connection strips 1014 and 1016 to the side wall 112.

Figure 11D:
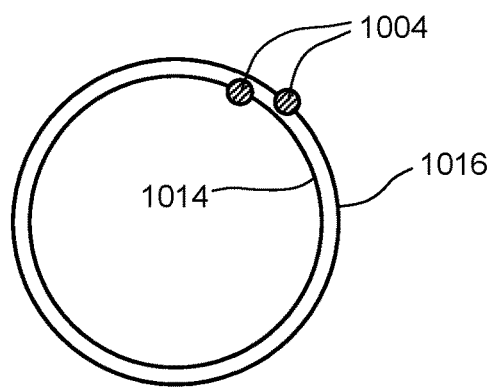
FIG. 11D is a schematic diagram illustrating ring-shaped electrical connection strips with conductive plugs in accordance with some embodiments.

In some configurations, each of the electrical connection strips 1014 and 1016 has a shape of a ring, as shown in FIG. 11D.

FIG. 12A is a cross-sectional view of a side wall 112 with a plug 1026 including liquid metal 1024 in accordance with some embodiments. The plug 1026 defines a hollow channel, and the liquid metal 1024 fills the hollow channel defined in the plug 1026. The plug 1026 is made of non-conductive material (e.g., rubber). In some configurations, the non-conductive material of the plug 1026 has mechanical and thermal properties comparable to the mechanical and thermal properties of the side wall 112 so that there is no excessive stress or strain at the interface between the non-conductive material (e.g., the plug 1026 or the non-conductive head 1028) and the side wall 112 when mechanical force is applied or when the temperature of the side wall 112 and the conductive plug changes.

The plug 1026 also includes electrical conductors 1032 and 1034 electrically coupled with the liquid metal 1024. For example, the electrical conductor 1032 extends to the outer surface 114 of the side wall 112, and the electrical conductor 1032 extends to the inner surface 116 of the side wall 112. In some configurations, the plug 1026 also has a plug head 1028 as shown in FIG. 12A.

Although FIG. 12A illustrates the plug 1026 defining a single hollow channel, in some other configurations, two or more hollow channels (e.g., micro channels) are defined in the plug 1026. In some configurations, the liquid metal filling the two or more hollow channels are in contact with a single, common electrical conductor so that only the single electrical conductor extends out of the plug head 1028 as shown in FIG. 12B. In some other configurations, the liquid metal filling a respective hollow channel is in contact with distinct electrical conductors so that multiple electrical conductors that are electrically isolated from one another extend out of the plug head 1028 as shown in FIGS. 12C and 12D.

In light of these examples and principles explained herein, we now turn to certain embodiments.

In accordance with some embodiments, a tire assembly includes a tire having an inside surface, an outside surface opposite to the inside surface, and a tire bead region; and two or more electrical conductors extending from the inside surface of the tire to at least the tire bead region (e.g., tire 202).

In some embodiments, the two or more electrical conductors are conductive films located on a surface of the tire (e.g., electrical conductors 224).

In some embodiments, the two or more electrical conductors, including a first electrical conductor (e.g., electrical conductor 224-1) and a second electrical conductor (e.g., electrical conductor 224-2) electrically insulated from the first electrical conductor, extend from the inside surface of the tire to the outside surface of the tire.

In some embodiments, the tire has an inner side wall, an outside side wall, and a tread region coupled to the inner side wall and the outside side wall and located between the inner side wall and the outside side wall (e.g., FIG. 1D). Each electrical conductor of the two or more electrical conductors extends from the outside surface of the tire to the inside surface of the tire on a particular side wall selected between the inner side wall and the outside side wall (e.g., FIG. 2E).

In some embodiments, the tire assembly includes an insulator layer positioned adjacent to a bead area of the tire coupled to the particular side wall so that one or more portions of the two or more electrical conductors are located between the insulator layer and the bead area of the tire (e.g., insulator layers 230).

In some embodiments, the tire assembly includes two or more internal electrical conductors extending circumferentially on the inside surface of the tire, including (i) a first internal electrical conductor (e.g., internal electrical conductor 234-1) that is electrically coupled with a first group of electrical conductors extending from the inside surface of the tire to the outside surface of the tire, including the first electrical conductor, and (ii) a second internal electrical conductor (e.g., internal electrical conductor 234-2) that is electrically coupled with a second group of electrical conductors extending from the inside surface of the tire to the outside surface of the tire, including the second electrical conductor, wherein the first group of electrical conductors is mutually exclusive from the second group of electrical conductors.

In some embodiments, the two or more electrical conductors extend radially on the outside surface of the tire (e.g., FIG. 2B).

In some embodiments, the tire assembly includes two or more external electrical conductors extending circumferentially on the outside surface of the tire, including (i) a first external electrical conductor (e.g., electrical conductor 324-1) that is electrically coupled with a first group of electrical conductors extending from the inside surface of the tire to the outside surface of the tire, including the first electrical conductor, and (ii) a second external electrical conductor (e.g., electrical conductor 324-2) that is electrically coupled with a second group of electrical conductors extending from the inside surface of the tire to the outside surface of the tire, including the second electrical conductor. The first group of electrical conductors is mutually exclusive from the second group of electrical conductors.

In accordance with some embodiments, a method of making a tire assembly includes providing a tire having an inside surface and an outside surface opposite to the inside surface; and placing two or more electrical conductors (e.g., FIG. 2C), including a first electrical conductor and a second electrical conductor electrically insulated from the first electrical conductor, so that the two or more electrical conductors extend from the inside surface of the tire and the outside surface of the tire (e.g., FIG. 2E).

In some embodiments, placing the two or more electrical conductors includes depositing a conductive ink or conductive film to form one or more portions of the two or more electrical conductors on the tire.

In accordance with some embodiments, a wheel assembly includes a wheel with two or more connecting electrical conductors (e.g., FIG. 4B) and a tire assembly (e.g., FIG. 4C) mounted on the wheel. The two or more connecting electrical conductors are configured to contact with the two or more electrical conductors of the tire assembly (e.g., when the tire assembly is mounted on the wheel).

In some embodiments, the wheel also includes two or more rim electrical conductors extending circumferentially in a rim region of the wheel, including a first rim electrical conductor (e.g., electrical conductor 534-1) electrically coupled with a first connecting electrical conductor of the two or more connecting electrical conductors and a second rim electrical conductor (e.g., electrical conductor 534-2) electrically coupled with a second connecting electrical conductor of the two or more connecting electrical conductors, wherein the second rim electrical conductor is electrically isolated from the first rim electrical conductor.

In accordance with some embodiments, an electrical connector assembly mountable on a tire of a wheel of a vehicle includes one or more electrical conductors (e.g., electrical conductors 224-1 and 224-2), a respective electrical conductor extending from an inside surface of the tire to an outside surface of the tire.

In some embodiments, the electrical connector assembly includes two or more electrical conductors electrically insulated from each other, a respective electrical conductor of the two or more electrical conductors extending from the inside surface of the tire to the outside surface of the tire (e.g., FIG. 2E).

In some embodiments, the one or more electrical conductors include a stub (e.g., stub 640) mountable on the tire (e.g., on a sidewall of the tire or a tread surface of the tire). The one or more electrical conductors are at least partially embedded in the stub along a length of the stub (e.g., FIGS. 6C and 6I).

In some embodiments, the stub includes two or more electrical conductors that are at least partially embedded in the stub coaxially (e.g., FIG. 6C).

In some embodiments, the respective electrical conductor includes: the stub with a hollow channel and a liquid metal filling the hollow channel defined in the stub (e.g., the plug 1026 and the liquid metal 1024); an internal electrode (e.g., electrical conductor 1034) electrically coupled with the liquid metal and extending to the inside surface of the tire; and an external electrode (e.g., electrical conductor 1032) electrically coupled with the liquid metal and extending to the outside surface of the tire.

In some embodiments, the stub includes (i) two or more hollow channels that are isolated from each other and (ii) the liquid metal filling the two or more hollow channels (e.g., FIG. 12C).

In some embodiments, the respective electrical conductor includes a conductive polymer or rubber (e.g., FIG. 10B).

In some embodiments, the electrical connector assembly includes an electrical connection strip electrically coupled with at least one electrical conductor of the one or more electrical conductors and configured to be positioned circumferentially adjacently to a tire bead of the tire (e.g., FIG. 10A).

In some embodiments, the electrical connector assembly includes two or more electrical connection strips that are electrically isolated from each other (e.g., FIG. 11B).

In some embodiments, the electrical connector assembly includes an insulator layer on which the two or more electrical connection strips are located (e.g., FIG. 11C).

In some embodiments, the two or more electrical connection strips include a first electrical connection strip electrically coupled with a first electrical conductor and a second electrical connection strip that is distinct from the first electrical connection strip and electrically coupled with a second electrical conductor distinct from the first electrical conductor. At least a portion of the first electrical connection strip adjacent to the second electrical conductor is curved to avoid contact between the second electrical conductor and the portion of the first electrical connection strip adjacent to the second electrical conductor, and at least a portion of the second electrical connection strip adjacent to the first electrical conductor is curved to avoid contact between the first electrical conductor and the portion of the second electrical connection strip adjacent to the first electrical conductor (e.g., FIG. 11C).

In some embodiments, the respective electrical conductor includes a conductive portion (e.g., a conductive bead wire 712) configured to be embedded within the tire. The respective electrical conductor includes one or more external conductive stubs extending from the embedded conductive portion to the outside surface of the tire and one or more internal conductive stubs extending from the embedded conductive portion to the inside surface of the tire.

In some embodiments, the respective electrical conductor is configured to extend from at least an inner side wall to at least an outer side wall when the respective electrical conductor is embedded at least partially within the tire (e.g., via electrical conductors 716 and 714).

In some embodiments, the one or more electrical conductors include a plurality of electrical conductors each configured to extend from at least the inner side wall to at least the outer side wall when embedded at least partially within the tire (e.g., electrical conductor 828). The electrical connector assembly also includes a first elongated electrical conductor (e.g., electrical conductor 712) electrically coupled with a first set of electrical conductors (e.g., the first set of electrical conductors 810-1) of the plurality of electrical conductors and a second elongated electrical conductor (e.g., electrical conductor 722) electrically coupled with a second set of electrical conductors (e.g., the first set of electrical conductors 810-2), of the plurality of electrical conductors, that is mutually exclusive to the first set of electrical conductors.

In some embodiments, the electrical connector assembly includes a third elongated electrical conductor (e.g., electrical conductor 912) that is distinct from the first elongated electrical conductor and electrically coupled with the first set of electrical conductors of the plurality of electrical conductors; and a fourth elongated electrical conductor (e.g., electrical conductor 922) that is distinct from the second elongated electrical conductor and electrically coupled with the second set of electrical conductors of the plurality of electrical conductors.

In some embodiments, the first elongated electrical conductor is a first bead wire, and the second elongated electrical conductor is a second bead wire (e.g., FIG. 9A).

In some embodiments, the first elongated electrical conductor is a first conductive belt, and the second elongated electrical conductor is a second conductive belt (e.g., FIG. 9B).

In accordance with some embodiments, a tire assembly includes a tire and one or more electrical connector assemblies embedded at least partially in the tire, each electrical connector assembly of the one or more electrical connector assemblies corresponding to any electrical connector assembly described herein.

In accordance with some embodiments, a tire assembly includes a tire defining a hollow channel; a liquid metal filling at least a portion of the hollow channel defined in the tire; one or more external conductive stubs electrically coupled with the liquid metal within the hollow channel and extending to an outside surface of the tire; and one or more internal conductive stubs electrically coupled with the liquid metal within the hollow channel and extending to an inside surface of the tire (e.g., FIG. 8C).

In accordance with some embodiments, a wheel assembly includes a wheel; any tire assembly described herein and mounted on the wheel; an energy-harvester mounted on the wheel; and one or more circuits electrically connected to the energy harvester via one or more electrical conductors.

Some embodiments may be described with respect to the following clauses:

Clause 1. A tire assembly, comprising:
  a tire having an inside surface, an outside surface opposite to the inside surface, and a tire bead region; and
  two or more electrical conductors extending from the inside surface of the tire to at least the tire bead region.

Clause 2. The tire assembly of clause 1, wherein:
  the two or more electrical conductors are conductive films located on a surface of the tire.

Clause 3. The tire assembly of clause 1 or 2, wherein:
  the two or more electrical conductors extend from the inside surface of the tire to the outside surface of the tire, including a first electrical conductor and a second electrical conductor electrically insulated from the first electrical conductor.

Clause 4. The tire assembly of clause 3, wherein:
  the tire has an inner side wall, an outside side wall, and a tread region coupled to the inner side wall and the outside side wall and located between the inner side wall and the outside side wall; and
  each electrical conductor of the two or more electrical conductors extends from the outside surface of the tire to the inside surface of the tire on a particular side wall selected between the inner side wall and the outside side wall.

Clause 5. The tire assembly of clause 4, further comprising:
  an insulator layer positioned adjacent to a bead area of the tire coupled to the particular side wall so that one or more portions of the two or more electrical conductors are located between the insulator layer and the bead area of the tire.

Clause 6. The tire assembly of clause 4 or 5, further comprising:
  two or more internal electrical conductors extending circumferentially on the inside surface of the tire, including (i) a first internal electrical conductor that is electrically coupled with a first group of electrical conductors extending from the inside surface of the tire to the outside surface of the tire, including the first electrical conductor, and (ii) a second internal electrical conductor that is electrically coupled with a second group of electrical conductors extending from the inside surface of the tire to the outside surface of the tire, including the second electrical conductor, wherein the first group of electrical conductors is mutually exclusive from the second group of electrical conductors.

Clause 7. The tire assembly of any of clauses 4-6, wherein:
the two or more electrical conductors extend radially on the outside surface of the tire.

Clause 8. The tire assembly of any of clauses 4-7, further comprising:
two or more external electrical conductors extending circumferentially on the outside surface of the tire, including (i) a first external electrical conductor that is electrically coupled with a first group of electrical conductors extending from the inside surface of the tire to the outside surface of the tire, including the first electrical conductor, and (ii) a second external electrical conductor that is electrically coupled with a second group of electrical conductors extending from the inside surface of the tire to the outside surface of the tire, including the second electrical conductor, wherein the first group of electrical conductors is mutually exclusive from the second group of electrical conductors.

Clause 9. A method of making a tire assembly, the method comprising:
providing a tire having an inside surface and an outside surface opposite to the inside surface; and
placing two or more electrical conductors, including a first electrical conductor and a second electrical conductor electrically insulated from the first electrical conductor, so that the two or more electrical conductors extend from the inside surface of the tire and the outside surface of the tire.

Clause 10. The method of clause 9, wherein:
placing the two or more electrical conductors includes depositing a conductive ink or conductive film to form one or more portions of the two or more electrical conductors on the tire.

Clause 11. A wheel assembly, comprising:
a wheel with two or more connecting electrical conductors; and
the tire assembly of any of clauses 1-3, the tire assembly being mounted on the wheel,
wherein the two or more connecting electrical conductors are configured to contact with the two or more electrical conductors of the tire assembly.

Clause 12. The wheel assembly of clause 11, wherein:
the wheel also includes two or more rim electrical conductors extending circumferentially in a rim region of the wheel, including a first rim electrical conductor electrically coupled with a first connecting electrical conductor of the two or more connecting electrical conductors and a second rim electrical conductor electrically coupled with a second connecting electrical conductor of the two or more connecting electrical conductors, wherein the second rim electrical conductor is electrically isolated from the first rim electrical conductor.

Clause 13. An electrical connector assembly mountable on a tire of a wheel of a vehicle, comprising:
one or more electrical conductors, a respective electrical conductor extending from an inside surface of the tire to an outside surface of the tire.

Clause 14. The electrical connector assembly of clause 13, including:
two or more electrical conductors electrically insulated from each other, a respective electrical conductor of the two or more electrical conductors extending from the inside surface of the tire to the outside surface of the tire.

Clause 15. The electrical connector assembly of clause 13 or 14, wherein:
the one or more electrical conductors include a stub mountable on the tire, wherein the one or more electrical conductors are at least partially embedded in the stub along a length of the stub.

Clause 16. The electrical connector assembly of clause 15, wherein:
the stub includes two or more electrical conductors that are at least partially embedded in the stub coaxially.

Clause 17. The electrical connector assembly of clause 15, wherein:
the respective electrical conductor includes:
the stub with a hollow channel and a liquid metal filling the hollow channel defined in the stub;
an internal electrode electrically coupled with the liquid metal and extending to the inside surface of the tire; and
an external electrode electrically coupled with the liquid metal and extending to the outside surface of the tire.

Clause 18. The electrical connector assembly of clause 17, wherein:
the stub includes two or more hollow channels that are isolated from each other and the liquid metal filling the two or more hollow channels.

Clause 19. The electrical connector assembly of any of clauses 13-18, wherein:
the respective electrical conductor includes a conductive polymer or rubber.

Clause 20. The electrical connector assembly of clause 19, further comprising:
an electrical connection strip electrically coupled with at least one electrical conductor of the one or more electrical conductors and configured to be positioned circumferentially adjacently to a tire bead of the tire.

Clause 21. The electrical connector assembly of clause 19 or 20, further comprising:
two or more electrical connection strips that are electrically isolated from each other.

Clause 22. The electrical connector assembly of clause 21, further comprising:
an insulator layer on which the two or more electrical connection strips are located.

Clause 23. The electrical connector assembly of clause 21 or 22, wherein:
the two or more electrical connection strips include a first electrical connection strip electrically coupled with a first electrical conductor and a second electrical connection strip that is distinct from the first electrical connection strip and electrically coupled with a second electrical conductor distinct from the first electrical conductor; and
at least a portion of the first electrical connection strip adjacent to the second electrical conductor is curved to avoid contact between the second electrical conductor and the portion of the first electrical connection strip adjacent to the second electrical conductor, and at least a portion of the second electrical connection strip adjacent to the first electrical conductor is curved to avoid contact between the first electrical conductor and the portion of the second electrical connection strip adjacent to the first electrical conductor.

Clause 24. The electrical connector assembly of clause 13, wherein:
the respective electrical conductor includes a conductive portion configured to be embedded within the tire; and
the respective electrical conductor includes one or more external conductive stubs extending from the embedded conductive portion to the outside surface of the tire and one or more internal conductive stubs extending from the embedded conductive portion to the inside surface of the tire.

Clause 25. The electrical connector assembly of clause 24, wherein:
the respective electrical conductor is configured to extend from at least an inner side wall to at least an outer side wall when the respective electrical conductor is embedded at least partially within the tire.

Clause 26. The electrical connector assembly of clause 25, wherein:
the one or more electrical conductors include a plurality of electrical conductors each configured to extend from at least the inner side wall to at least the outer side wall when embedded at least partially within the tire; and
the electrical connector assembly also includes a first elongated electrical conductor electrically coupled with a first set of electrical conductors of the plurality of electrical conductors and a second elongated electrical conductor electrically coupled with a second set of electrical conductors, of the plurality of electrical conductors, that is mutually exclusive to the first set of electrical conductors.

Clause 27. The electrical connector assembly of clause 26, further comprising:
a third elongated electrical conductor that is distinct from the first elongated electrical conductor and electrically coupled with the first set of electrical conductors of the plurality of electrical conductors; and
a fourth elongated electrical conductor that is distinct from the second elongated electrical conductor and electrically coupled with the second set of electrical conductors of the plurality of electrical conductors.

Clause 28. The electrical connector assembly of clause 26 or 27, wherein:
the first elongated electrical conductor is a first bead wire; and
the second elongated electrical conductor is a second bead wire.

Clause 29. The electrical connector assembly of clause 26 or 27, wherein:
the first elongated electrical conductor is a first conductive belt; and
the second elongated electrical conductor is a second conductive belt.

Clause 30. A tire assembly, comprising:
a tire; and
one or more electrical connector assemblies embedded at least partially in the tire, each electrical connector assembly of the one or more electrical connector assemblies corresponding to the electrical connector assembly of any of clauses 13-29.

Clause 31. A tire assembly, comprising:
a tire defining a hollow channel;
a liquid metal filling at least a portion of the hollow channel defined in the tire;
one or more external conductive stubs electrically coupled with the liquid metal within the hollow channel and extending to an outside surface of the tire; and
one or more internal conductive stubs electrically coupled with the liquid metal within the hollow channel and extending to an inside surface of the tire.

Clause 32. A wheel assembly, comprising:
a wheel;
the tire assembly of any of clauses 1-8 and 30-31, the tire assembly being mounted on the wheel;
an energy harvester mounted on the wheel; and
one or more electrical components electrically connected to the energy harvester via one or more electrical conductors.

The foregoing description, for purpose of explanation, has been described with reference to specific embodiments. However, the illustrative discussions above are not intended to be exhaustive or to limit the scope of claims to the precise forms disclosed. Many modifications and variations are possible in view of the above teachings. The embodiments were chosen and described in order to best explain the principles of the various described embodiments and their practical applications, to thereby enable others skilled in the art to best utilize the principles and the various described embodiments with various modifications as are suited to the particular use contemplated.

What is claimed is:

1. A tire assembly, comprising:
a tire having an inside surface, an outside surface opposite to the inside surface, and a tire bead region, wherein the tire has an inner side wall, an outside side wall, and a tread region coupled to the inner side wall and the outside side wall and located between the inner side wall and the outside side wall;
two or more electrical conductors extending from the inside surface of the tire to at least the tire bead region, including a first electrical conductor and a second electrical conductor electrically insulated from the first electrical conductor, wherein each electrical conductor of the two or more electrical conductors extends from the outside surface of the tire to the inside surface of the tire on a particular side wall selected between the inner side wall and the outside side wall; and
two or more internal electrical conductors extending circumferentially on the inside surface of the tire, including (i) a first internal electrical conductor that is electrically coupled with a first group of electrical conductors extending from the inside surface of the tire to the outside surface of the tire, including the first electrical conductor, and (ii) a second internal electrical conductor that is electrically coupled with a second group of electrical conductors extending from the inside surface of the tire to the outside surface of the tire, including the second electrical conductor, wherein the first group of electrical conductors is mutually exclusive from the second group of electrical conductors.

2. The tire assembly of claim 1, wherein:
the two or more electrical conductors are conductive films located on a surface of the tire.

3. The tire assembly of claim 1, further comprising:
an insulator layer positioned adjacent to a bead area of the tire coupled to the particular side wall so that one or more portions of the two or more electrical conductors are located between the insulator layer and the bead area of the tire.

4. The tire assembly of claim 1, wherein:
the two or more electrical conductors extend radially on the outside surface of the tire.

5. The tire assembly of claim 1, further comprising:
two or more external electrical conductors extending circumferentially on the outside surface of the tire, including (i) a first external electrical conductor that is electrically coupled with a first group of external electrical conductors extending from the inside surface of the tire to the outside surface of the tire, including the first electrical conductor, and (ii) a second external electrical conductor that is electrically coupled with a second group of external electrical conductors extending from the inside surface of the tire to the outside surface of the tire, including the second electrical conductor, wherein the first group of external electrical conductors is mutually exclusive from the second group of external electrical conductors.

6. A wheel assembly, comprising:
a wheel with two or more connecting electrical conductors; and
the tire assembly of claim 1, the tire assembly being mounted on the wheel,
wherein the two or more connecting electrical conductors are configured to contact with the two or more electrical conductors of the tire assembly.

7. The wheel assembly of claim 6, wherein:
the wheel also includes two or more rim electrical conductors extending circumferentially in a rim region of the wheel, including a first rim electrical conductor electrically coupled with a first connecting electrical conductor of the two or more connecting electrical conductors and a second rim electrical conductor electrically coupled with a second connecting electrical conductor of the two or more connecting electrical conductors, wherein the second rim electrical conductor is electrically isolated from the first rim electrical conductor.

8. A wheel assembly, comprising:
a wheel;
the tire assembly of claim 1, the tire assembly being mounted on the wheel;
an energy harvester mounted on the wheel; and
one or more electrical components electrically connected to the energy harvester via the two or more electrical conductors.

9. A method of making a tire assembly, the method comprising:
providing a tire having an inside surface and an outside surface opposite to the inside surface, wherein the tire has an inner side wall, an outside side wall, and a tread region coupled to the inner side wall and the outside side wall and located between the inner side wall and the outside side wall;
placing two or more electrical conductors, including a first electrical conductor and a second electrical conductor electrically insulated from the first electrical conductor, so that the two or more electrical conductors extend from the inside surface of the tire and the outside surface of the tire; and
placing two or more internal electrical conductors extending circumferentially on the inside surface of the tire, including (i) a first internal electrical conductor that is electrically coupled with a first group of electrical conductors extending from the inside surface of the tire to the outside surface of the tire, including the first electrical conductor, and (ii) a second internal electrical conductor that is electrically coupled with a second group of electrical conductors extending from the inside surface of the tire to the outside surface of the tire, including the second electrical conductor, wherein the first group of electrical conductors is mutually exclusive from the second group of electrical conductors.

10. The method of claim 9, wherein:
placing the two or more electrical conductors includes depositing a conductive ink or conductive film to form one or more portions of the two or more electrical conductors on the tire.

11. A tire assembly, comprising:
a tire defining a hollow channel;
a liquid metal filling at least a portion of the hollow channel defined in the tire;
one or more external conductive stubs electrically coupled with the liquid metal within the hollow channel and extending to an outside surface of the tire; and
one or more internal conductive stubs electrically coupled with the liquid metal within the hollow channel and extending to an inside surface of the tire.

12. A wheel assembly, comprising:
a wheel;
the tire assembly of claim 11, the tire assembly being mounted on the wheel;
an energy harvester mounted on the wheel; and
one or more electrical components electrically connected to the energy harvester via the one or more external conductive stubs.

13. A tire assembly, comprising:
a tire having an inside surface, an outside surface opposite to the inside surface, and a tire bead region, wherein the tire has an inner side wall, an outside side wall, and a tread region coupled to the inner side wall and the outside side wall and located between the inner side wall and the outside side wall;
two or more electrical conductors extending from the inside surface of the tire to at least the tire bead region, including a first electrical conductor and a second electrical conductor electrically insulated from the first electrical conductor, wherein each electrical conductor of the two or more electrical conductors extends from the outside surface of the tire to the inside surface of the tire on a particular side wall selected between the inner side wall and the outside side wall; and
two or more external electrical conductors extending circumferentially on the outside surface of the tire, including (i) a first external electrical conductor that is electrically coupled with a first group of electrical conductors extending from the inside surface of the tire to the outside surface of the tire, including the first electrical conductor, and (ii) a second external electrical conductor that is electrically coupled with a second group of electrical conductors extending from the inside surface of the tire to the outside surface of the tire, including the second electrical conductor, wherein the first group of electrical conductors is mutually exclusive from the second group of electrical conductors.

14. The tire assembly of claim 13, wherein:
the two or more electrical conductors are conductive films located on a surface of the tire.

15. The tire assembly of claim 13, further comprising:
an insulator layer positioned adjacent to a bead area of the tire coupled to the particular side wall so that one or more portions of the two or more electrical conductors are located between the insulator layer and the bead area of the tire.

16. The tire assembly of claim 13, wherein:
the two or more electrical conductors extend radially on the outside surface of the tire.

17. A method of making the tire assembly of claim 13, the method comprising:
providing the tire having the inside surface and the outside surface opposite to the inside surface;
placing the two or more electrical conductors, including a first electrical conductor and a second electrical conductor electrically insulated from the first electrical conductor, wherein each electrical conductor of the two or more electrical conductors extends from the outside surface of the tire to the inside surface of the tire on a particular side wall selected between the inner side wall and the outside side wall; and
placing the two or more external electrical conductors extending circumferentially on the outside surface of the tire, including (i) a first external electrical conductor that is electrically coupled with a first group of electrical conductors extending from the inside surface of the tire to the outside surface of the tire, including the first electrical conductor, and (ii) a second external electrical conductor that is electrically coupled with a second group of electrical conductors extending from the inside surface of the tire to the outside surface of the tire, including the second electrical conductor, wherein the first group of electrical conductors is mutually exclusive from the second group of electrical conductors.

18. The method of claim 17, wherein placing the two or more electrical conductors includes depositing a conductive ink or conductive film to form one or more portions of the two or more electrical conductors on the tire.

19. A wheel assembly, comprising:
a wheel with two or more connecting electrical conductors; and
the tire assembly of claim 13, the tire assembly being mounted on the wheel,
wherein the two or more connecting electrical conductors are configured to contact with the two or more electrical conductors of the tire assembly.

20. The wheel assembly of claim 19, wherein:
the wheel also includes two or more rim electrical conductors extending circumferentially in a rim region of the wheel, including a first rim electrical conductor electrically coupled with a first connecting electrical conductor of the two or more connecting electrical conductors and a second rim electrical conductor electrically coupled with a second connecting electrical conductor of the two or more connecting electrical conductors, wherein the second rim electrical conductor is electrically isolated from the first rim electrical conductor.

21. A wheel assembly, comprising:
a wheel;
the tire assembly of claim 13, the tire assembly being mounted on the wheel;
an energy harvester mounted on the wheel; and
one or more electrical components electrically connected to the energy harvester via the two or more electrical conductors.

* * * * *